United States Patent
Jiang et al.

(12) 
(10) Patent No.: US 6,556,610 B1
(45) Date of Patent: *Apr. 29, 2003

(54) SEMICONDUCTOR LASERS

(75) Inventors: Wenbin Jiang, Thousand Oaks, CA (US); Chan-Long Shieh, Paradise Valley, AZ (US); Xiqing Sun, Gilbert, AZ (US); Jeff Tsao, Albuquerque, NM (US); Hsing-Chung Lee, Calabasas, CA (US)

(73) Assignee: E20 Communications, Inc., Calabasas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/834,521

(22) Filed: Apr. 12, 2001

(51) Int. Cl.⁷ .............................. H01S 3/094; H01S 5/00
(52) U.S. Cl. ............................................. 372/75; 372/50
(58) Field of Search ................................ 372/50, 75, 26, 372/96

(56) References Cited

U.S. PATENT DOCUMENTS

| | | |
|---|---|---|
| 3,949,320 A | 4/1976 | Castleberry et al. |
| 4,633,476 A | 12/1986 | Scifres et al. |
| 4,878,104 A | 10/1989 | Reed et al. |
| 4,901,330 A | 2/1990 | Wolfram et al. |
| 5,008,717 A | 4/1991 | Bar-Joseph et al. |
| 5,023,879 A | 6/1991 | Wang et al. |
| 5,163,058 A | 11/1992 | Farries et al. |
| 5,165,065 A | 11/1992 | Reed et al. |
| 5,216,687 A | 6/1993 | Fujino et al. |
| 5,231,642 A | 7/1993 | Scifres et al. |
| 5,291,502 A | 3/1994 | Pezeshki et al. |
| 5,351,256 A | 9/1994 | Schneider et al. |
| 5,414,726 A | 5/1995 | Raj et al. |
| 5,461,637 A | 10/1995 | Mooradian et al. |
| 5,485,014 A | 1/1996 | Jain et al. |
| 5,504,772 A | 4/1996 | Deacon et al. |
| 5,513,204 A | 4/1996 | Jayaraman |
| 5,536,085 A | 7/1996 | Li et al. |
| 5,623,359 A | 4/1997 | Giles et al. |
| 5,625,635 A | 4/1997 | Kurtz et al. |
| 5,627,853 A | 5/1997 | Mooradian et al. |
| 5,671,243 A | 9/1997 | Yap |

(List continued on next page.)

OTHER PUBLICATIONS

Joseph T. Verdeyen; Laser Electronics, Third Edition; pp. 347–351, 517–534; 1981; Prentice–Hall, Inc. New Jersey.

Eli Kapon; Semiconductor Lasers II, Materials and Structures; pp. 164–179; Institute of Micro and Optoelectronics Department of Physics Swiss Federal Institute of Technology, Lausanne; Academic Press; 1999.

*Primary Examiner*—Paul Ip
*Assistant Examiner*—James Menefee
(74) *Attorney, Agent, or Firm*—Blakely Sokoloff Taylor & Zafman

(57) ABSTRACT

Semiconductor lasers are formed by integrating an electrically pumped semiconductor laser, a beam steering element and a vertical cavity surface emitting laser (VCSEL) together. The electrically pumped semiconductor laser is modulated to modulate a pump beam of photons at a first wavelength. The beam steering element directs the pump beam to the VCSEL to provide optical pumping. The VCSEL receives the pump beam of photons at the first wavelength and is stimulated to emit photons of a laser beam at a second wavelength longer than the first. In embodiments, index guiding is provided in the VCSEL to improve the optical pumping and emission efficiencies when the pump beam is modulated at high frequencies. Embodiments of the beam steering element include a silicon bench, a polymer element, and a facet included in the edge emitting laser and an external mirror. Embodiments of index guiding include an air gap to form a mesa and an oxide confinement ring shaped layer.

100 Claims, 13 Drawing Sheets

U.S. PATENT DOCUMENTS

| | | | |
|---|---|---|---|
| 5,680,411 A | * 10/1997 | Ramdane et al. | 372/50 |
| 5,754,578 A | * 5/1998 | Jayaraman | 372/50 |
| 5,778,015 A | 7/1998 | Gunning et al. | |
| 5,793,787 A | 8/1998 | Meyer et al. | |
| 5,796,771 A | * 8/1998 | DenBaars et al. | 372/75 |
| 5,835,517 A | 11/1998 | Jayaraman et al. | |
| 5,841,799 A | 11/1998 | Hiroki | |
| 5,914,976 A | * 6/1999 | Jayaraman et al. | 372/50 |
| 5,963,576 A | 10/1999 | Claisse et al. | |
| 5,966,234 A | 10/1999 | Ford et al. | |
| 5,976,905 A | 11/1999 | Cokerill et al. | |
| 5,985,686 A | 11/1999 | Jayaraman | |
| 6,026,108 A | 2/2000 | Lim et al. | |
| 6,054,335 A | 4/2000 | Sun et al. | |
| 6,066,859 A | 5/2000 | Stegmueller | |
| 6,097,742 A | * 8/2000 | Caprara et al. | 372/22 |
| 6,104,739 A | 8/2000 | Hong et al. | |
| 6,127,200 A | 10/2000 | Ohiso et al. | |
| 6,167,068 A | * 12/2000 | Caprara et al. | 372/22 |
| 6,195,381 B1 | 2/2001 | Botez et al. | |
| 6,252,896 B1 | 6/2001 | Tan et al. | |
| 6,285,704 B1 | 9/2001 | Kullander-Sjoberg et al. | |
| 6,339,607 B1 | * 1/2002 | Jiang et al. | 372/50 |
| 6,347,108 B2 | * 2/2002 | Jiang et al. | 372/50 |
| 6,424,669 B1 | * 7/2002 | Jiang et al. | 372/50 |

\* cited by examiner

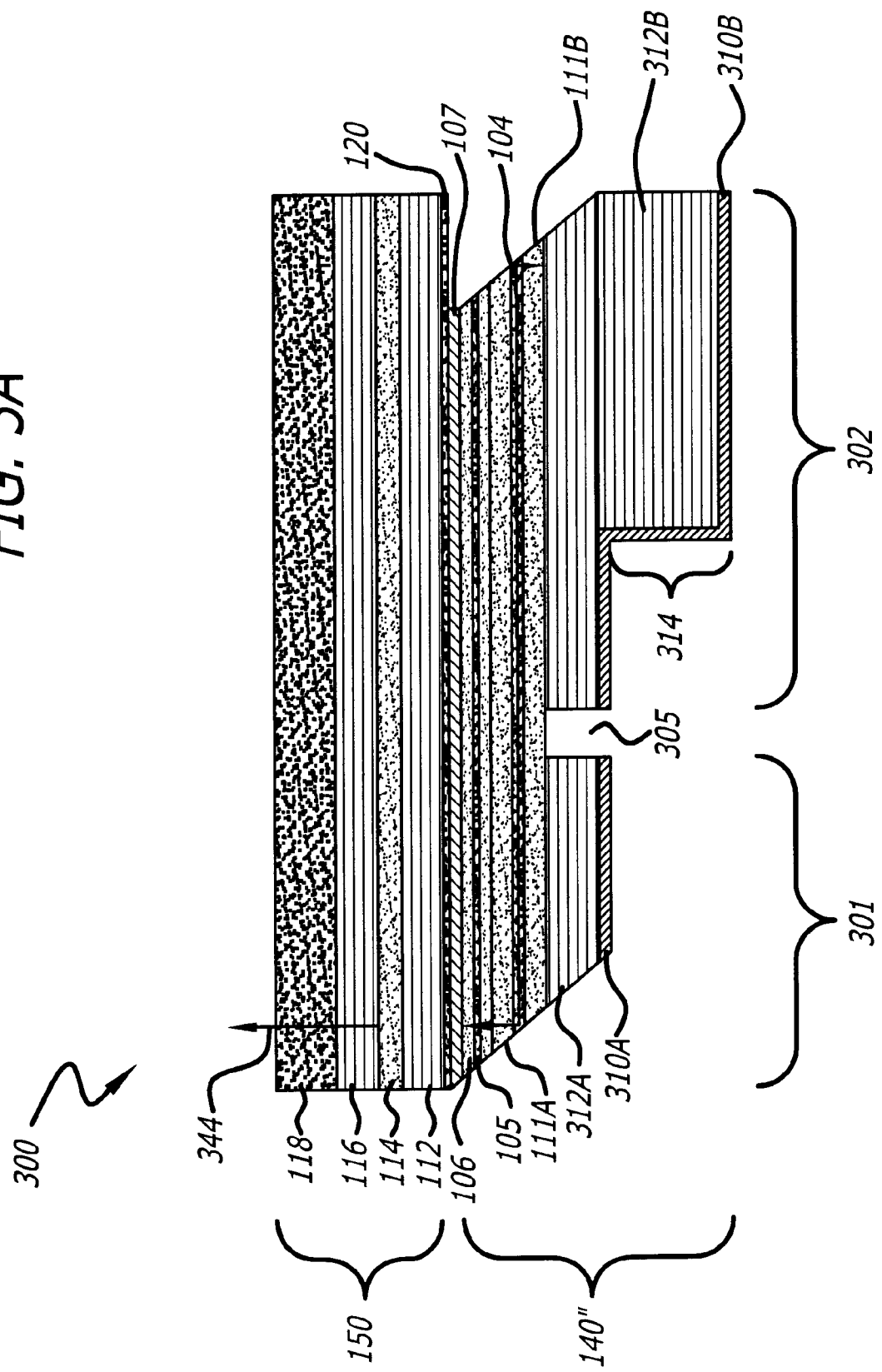

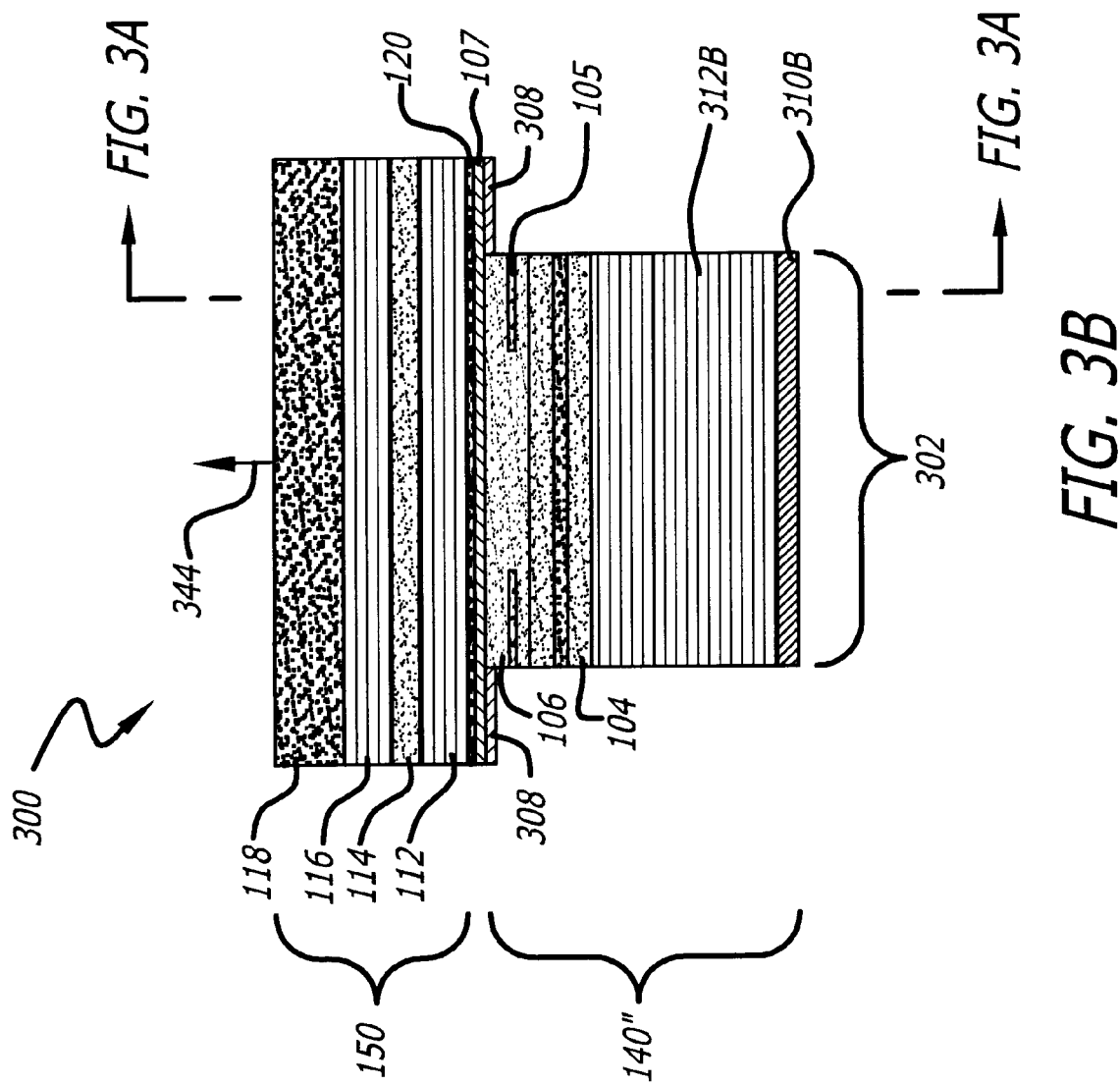

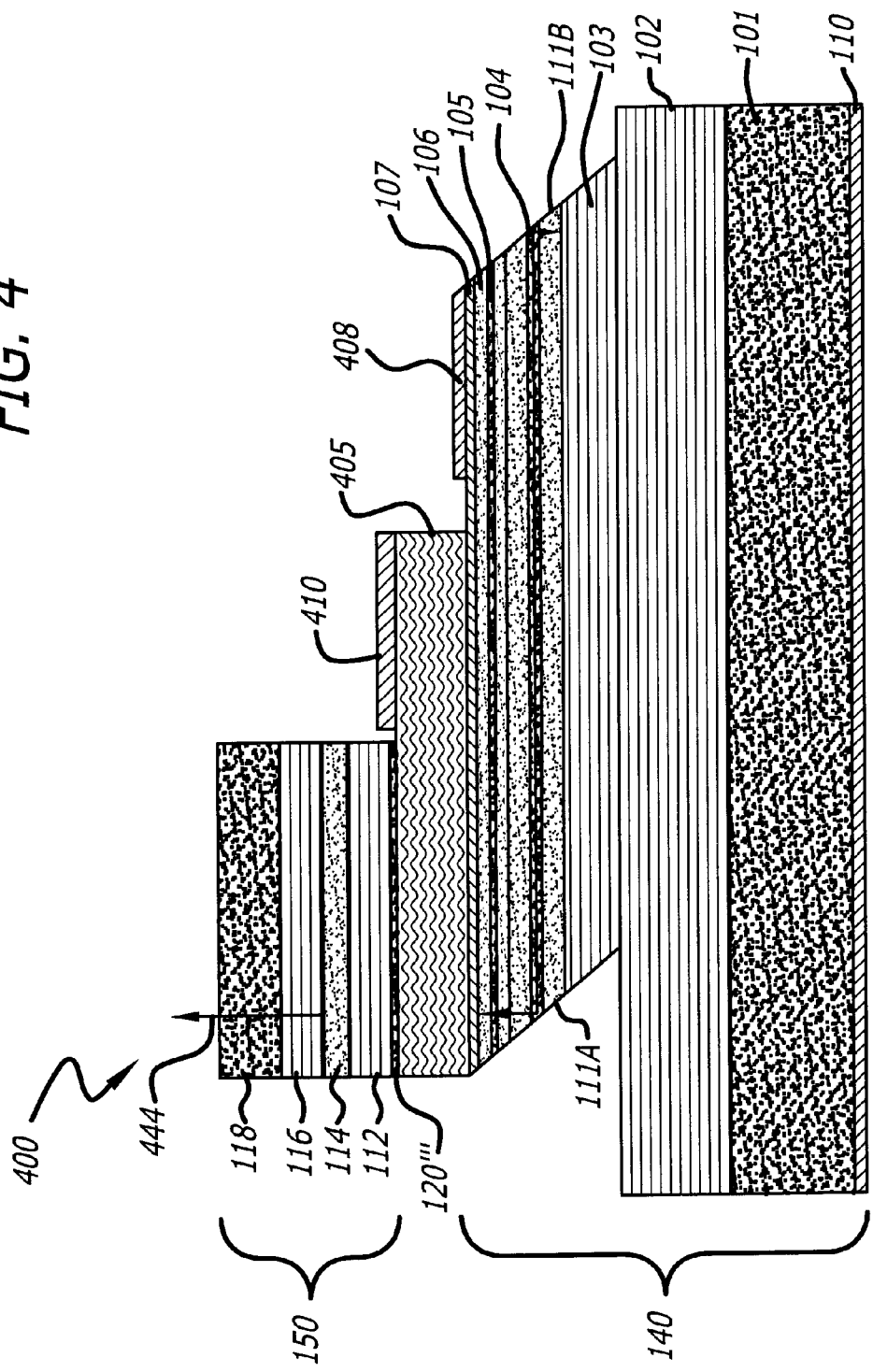

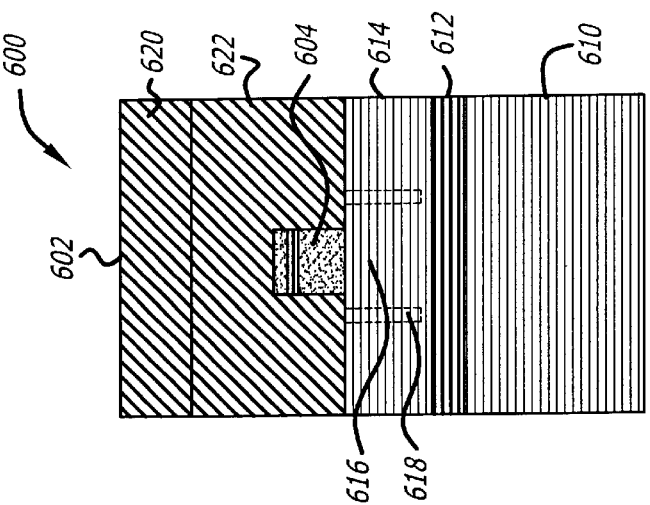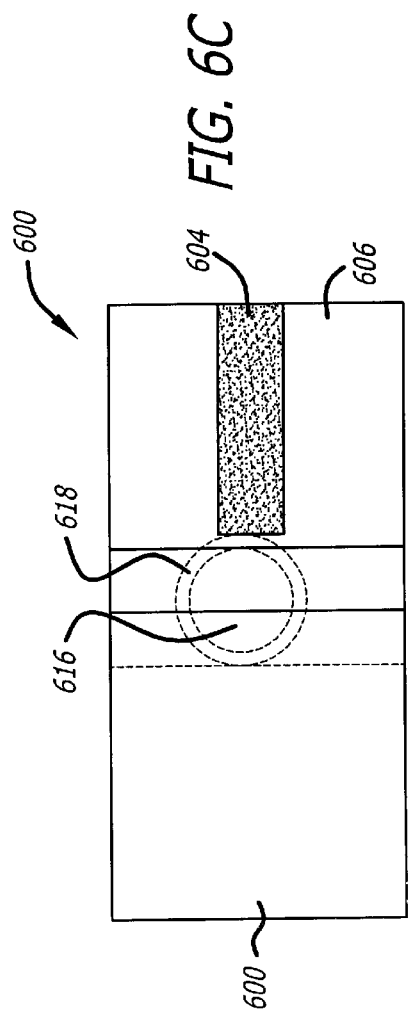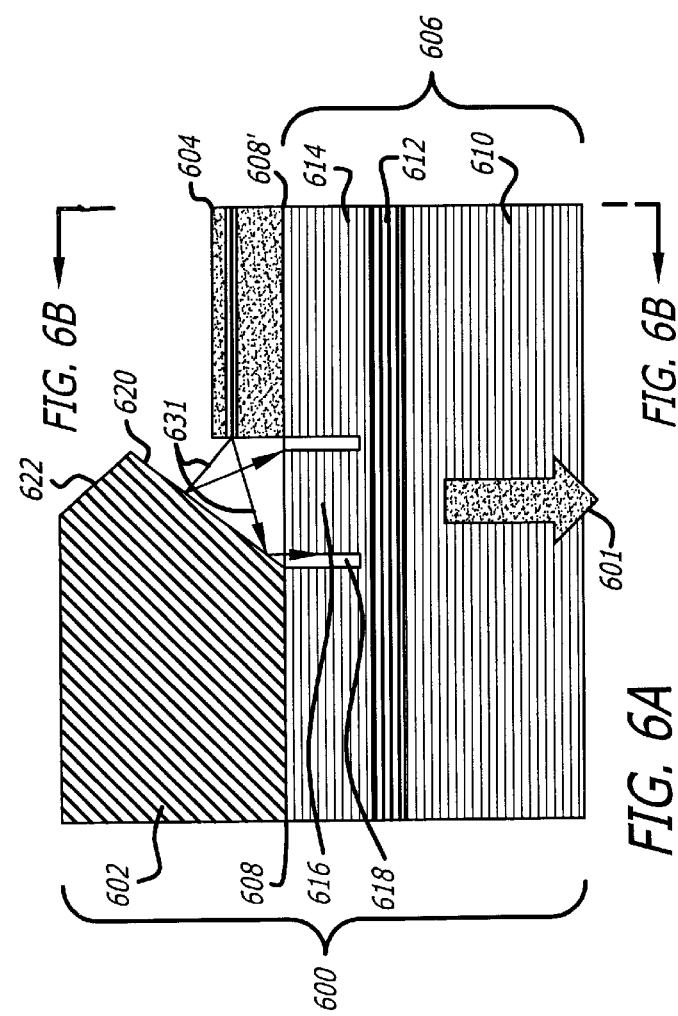

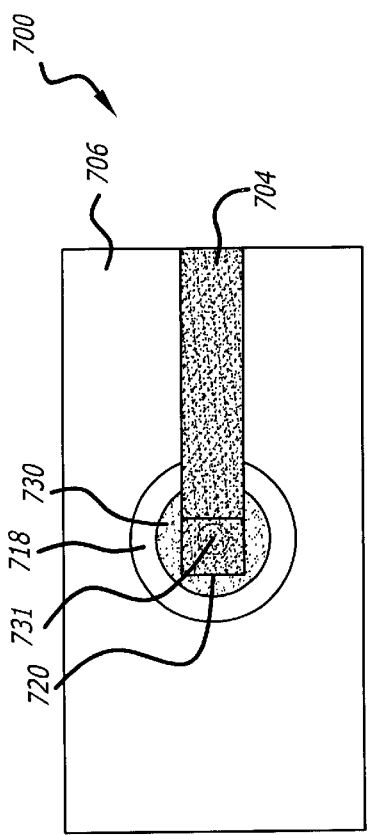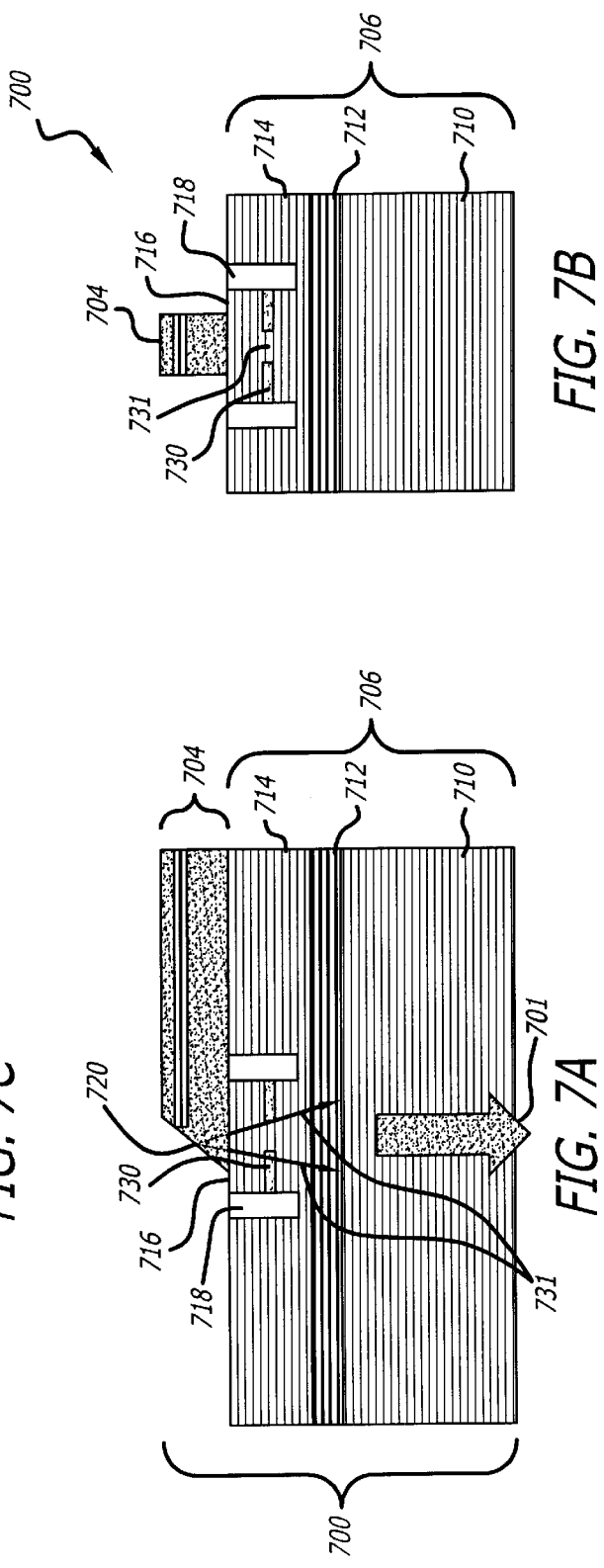

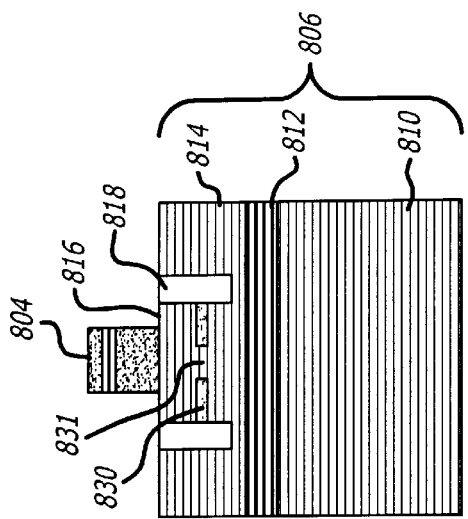
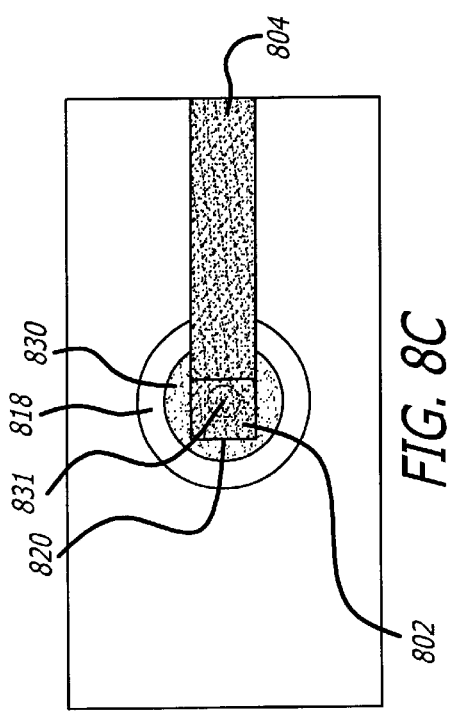
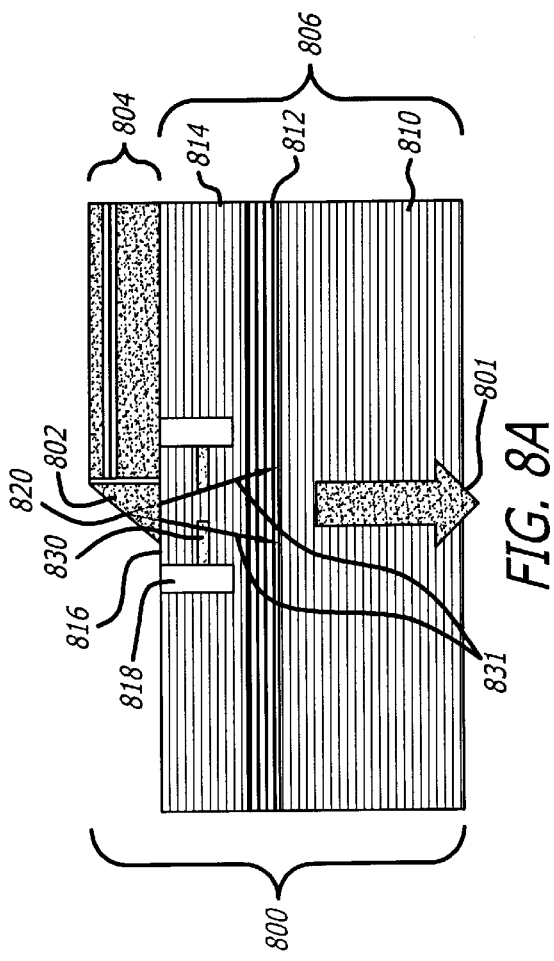

SEMICONDUCTOR LASERS

CROSS REFERENCE TO RELATED APPLICATIONS

This application is related to U.S. application Ser. No. 09/400,359, filed Sep. 20, 1999 by inventors Wenbin Jiang et al the disclosure of which is hereby incorporated by reference, verbatim and with the same effect as though they were fully and completely set forth herei; and is also related to U.S. application Ser. No. 09/430,570, filed Oct. 29, 1999 by inventors Wenbin Jiang et al; and is also related to U.S. application Ser. No. 09/560,008, filed Apr. 27, 2000 by inventors Wenbin Jiang et al, all of which are to be assigned to E2O Communications, Inc.

FIELD OF THE INVENTION

The invention relates generally to semiconductor lasers. More particularly, the invention relates to optical pumping of semiconductor lasers.

BACKGROUND OF THE INVENTION

Semiconductor lasers have become more important. One of the most important applications of semiconductor lasers is in communication systems where fiber optic communication media is employed. With growth in electronic communication, communication speed has become more important in order to increase data bandwidth in electronic communication systems. Improved semiconductor lasers can play a vital roll in increasing data bandwidth in communication systems using fiber optic communication media such as local area networks (LANs), metropolitan area networks (MANs) and wide area networks (WANs). A preferred component for optical interconnection of electronic components and systems via optical fibers is a semiconductor laser.

One type of well known semiconductor laser is a vertical cavity surface emitting laser (VCSEL). The current state of design and operation of VCSELs is well known. Due to optical properties of optical fibers, photons emitted at longer wavelengths from a laser tend to propagate longer distances and are less disturbed by optical noise sources. Thus, forming a VCSEL that can operate at longer wavelengths, such as a wavelength greater than 1.25 $\mu$m, is desirable.

Lasers can be excited or pumped in a number of ways. Typically, VCSELs have been electrically excited (i.e. electrically pumped) by a power supply in order to stimulate photon emission. However, achieving photon emission at long wavelengths using electrical pumping is difficult. More recently it has been shown that a VCSEL can be optically excited (i.e. optically pumped) to stimulate photon emission.

In order to use a semiconductor laser in communication systems, the laser output needs to be modulated somehow to communicate a signal. One type of laser modulation scheme varies the intensity of the light generated by the laser. Oftentimes this has been done externally from the laser, similar; to a camera's shutter allowing light to pass through to an unexposed film. However, this requires additional elements. It is desirable to directly modulate a semiconductor laser in an efficient manner.

BRIEF DESCRIPTIONS OF THE DRAWINGS

FIG. 3A is a magnified cross-sectional view of another embodiment of the modulated integrated optically pumped VCSEL of the invention.

FIG. 3B is a magnified back side view of the integrated optically pumped vertical cavity surface emitting laser of FIG. 3A.

FIG. 4 is a magnified side view of another embodiment of the modulated integrated optically pumped VCSEL of the invention.

FIG. 6A is a magnified side view of another embodiment of an integrated optically pumped vertical cavity surface emitting laser.

FIG. 6B is a magnified cross-sectional front view of the integrated optically pumped vertical cavity surface emitting laser of FIG. 6A.

FIG. 6C is a magnified cross-sectional front view of the integrated optically pumped vertical cavity surface emitting laser of FIG. 6A.

FIG. 7A is a magnified side view of another embodiment of an integrated optically pumped vertical cavity surface emitting laser.

FIG. 7B is a magnified cross-sectional front view of the integrated optically pumped vertical cavity surface emitting laser of FIG. 7A.

FIG. 7C is a magnified cross-sectional front view of the integrated optically pumped vertical cavity surface emitting laser of FIG. 7A.

FIG. 8A is a magnified side view of another embodiment of an integrated optically pumped vertical cavity surface emitting laser.

FIG. 8B is a magnified cross-sectional front view of the integrated optically pumped vertical cavity surface emitting laser of FIG. 8A.

FIG. 8C is a magnified cross-sectional front view of the integrated optically pumped vertical cavity surface emitting laser of FIG. 8A.

Like reference numbers and designations in the drawings indicate like elements providing similar functionality.

DETAILED DESCRIPTION OF THE PREFERRED EMBODIMENT

Figure 1B:
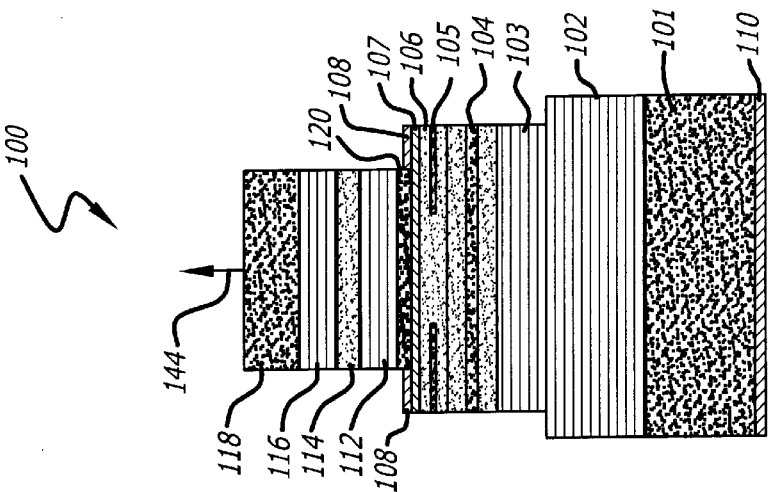
FIG. 1B is a magnified cross-sectional front view of the integrated optically pumped vertical cavity surface emitting laser of FIG. 1A.

In the following detailed description of the invention, numerous specific details are set forth in order to provide a thorough understanding of the invention. However, it will be obvious to one skilled in the art that the invention may be practiced without these specific details. In other instances well known methods, procedures, components, and circuits have not been described in detail so as not to unnecessarily obscure aspects of the invention.

For operation at high frequencies, an optically pumped long wavelength vertical cavity surface emitting laser (VCSEL) seems to be the preferable type of semiconductor laser. A VCSEL that is optically pumped need not be doped to lase. Therefore an optically pumped VCSEL need not have its high frequency operation limited by parasitic capacitance and inductance caused by dopants and metal contact pads that would otherwise have been added. The only high frequency limits of an optically pumped VCSEL would be as a result of its intrinsic carrier transport time and thermionic emission. The high frequency limits due to intrinsic carrier transport time and thermionic emission do not usually take effect until modulation frequencies of twenty giga-Hertz (20 GHz) or more are reached. Furthermore, VCSEL emission frequency is strongly confined by its high cavity-Q and cavity resonance, and thus laser modulation chirping is not as pronounced as an electrically pumped conventional in-plane semiconductor laser. Therefore, an optically pumped VCSEL has greater commercial potential for operation at high frequencies of modulation.

In order to modulate an optically pumped VCSEL at high frequencies, the invention directly modulates the pump laser, which in turn modulates the optically pumped VCSEL. The optically pumped VCSEL responds to the modulated pump laser and emits photons that are modulated accordingly.

At high modulation frequencies the modulated pump laser beam is important to the performance of the optically pumped VCSEL and the emission of long wavelength photons, especially when modulation is desired at 1 gigabit per second or greater. Typically, optical pumping is gain guided by the pump beam. Because of the gain guiding, the mode behavior of the optically pumped VCSEL tends to fluctuate with the pump beam. In this case, the optically pumped beam is relatively noisy and the transverse mode may not stay at a more desirable fundamental mode.

Index guiding is introduced to an optically pumped VCSEL to overcome the problems associated with the gain guiding only. One embodiment of the invention provides an index guided optically pumped VCSEL.

To minimize turn-on delay and pulse jitter, the optically pumped VCSEL can be pre-biased just above its threshold to ensure the maximum extinction ratio in another embodiment of the invention. In NRZ (non-return-to-zero) modulation, the extinction ratio (ER) is the ratio of the power output of photons in a data-on state input to the power output of photons in a data-off state input. In communications systems, a larger ER is preferred but it is usually difficult to achieve due to poor laser performance. The threshold of an optically pumped VCSEL is the input optical pump power needed for the VCSEL to reach lasing threshold. With an optically pumped VCSEL being close to its threshold level, the power output of photons from it corresponding to the data-off state is very low. Thus the ER can be very large with the optically pumped VCSEL in this condition. To accomplish this, the invention maintains a minimum pump laser power output level just above the VCSEL threshold power level. Modulating the pump laser well beyond its own threshold current level reduces jitter and the turn-on delay becomes negligible. Additionally, any chirping of the pump laser from modulation will have a minimal impact on the optically pumped VCSEL. This is so because the optically pumped VCSEL is insensitive to wavelength variations of photons generated by the pump laser.

A limiting factor of the pump laser that effects the optically pumped VCSEL is the parasitics of the pump laser. Parasitics, such as resistance, capacitance and inductance, tend to limit the achievable direct modulation frequency of the electrically pumped laser, which in turn can impact the direct modulation frequency of the long wavelength VCSEL. The invention can substantially reduces the problem posed by parasitics. In a number of embodiments of the invention, the pump laser has two sectional areas. One of the two sectional areas is always biased with a current so as to keep the pump laser turned on. This one sectional area is always sufficiently biased by a current to keep the optically pumped VCSEL just at its lasing threshold. The second of the two sectional areas is used to modulate the pump laser, which in turn modulates the optically pumped VCSEL. Splitting the pump laser into two sectional areas partitions the parasitics so that a lower level of parasitics in the pump laser need only be modulated. In another embodiment, an electric-absorption (EA) modulator is used to modulate the light or photons generated by the pump laser before being coupled into the optically pumped VCSEL. The parasitics associated with modulating the electric-absorption (EA) modulator are minimal such that modulation of the optically pumped VCSEL can occur at high frequencies.

In one embodiment of the invention a modulated integrated optically pumped VCSEL is provided which is optically pumped by an electrically pumped folded cavity surface emitting laser (FCSEL). The modulated integrated optically pumped VCSEL can be modulated at high frequencies and is preferably formed to generated photons of relatively long wavelengths. The FCSEL is electrically pumped and its photon output modulated in order to modulate the optically pumped VCSEL at high speeds. The integrated optically pumped vertical cavity surface emitting laser (VCSEL) is formed by integrating the electrically pumped FCSEL with an optically pumped VCSEL. Preferably, the FCSEL is designed to emit photons of relatively short wavelengths while the optically pumped VCSEL is designed to emit photons of relatively long wavelengths. The electrically pumped FCSEL and optically pumped VCSEL can be integrated together in a number of ways including atomic bonding, wafer bonding, metal bonding, epoxy glue or other well known semiconductor bonding techniques. A number of embodiments of the modulated integrated optically pumped VCSEL are disclosed.

The electrically pumped FCSEL is preferably designed to operate at relatively short wavelengths (from 770 nanometers (nm) to 1100 nanometers (nm)) with an optically pumped VCSEL designed to operate preferably at relatively long wavelengths (from 1250 nm to 1700 nm). The optically pumped VCSEL operates without the use of electric power by being optically pumped by the electrically pumped FCSEL. Integration of the lasers depends upon the type of semiconductor materials utilized in forming the two lasers. The two lasers are integrated into one unit through semiconductor processing methods such as monolithic epitaxial growth or by joining outer layers of the two lasers together through atomic bonding, wafer bonding, metal bonding, epoxy glue or other well known semiconductor bonding techniques. Additionally, the optically pumped VCSEL can be bonded to the FCSEL at an angle in order to avoid reflected light from the long wavelength VCSEL being directly returned to the in-plane laser to thereby avoiding optical noise being fed back into the FCSEL. A third laser can also be used to generate a small spot pump beam to couple to the optically pumped VCSEL in order to gain guide photons to emit at a single mode transversely. Although the electrically pumped FCSEL, also referred to as the pump laser, can be multimode either longitudinally or transversely, the output from the optically pumped VCSEL is single mode longitudinally. The output from the optically pumped VCSEL can be single mode transversely depending upon the geometric integration scheme and patterning. It is preferred that the optically pumped VCSEL operate in a single transverse mode to optimally couple with a single mode fiber. Modulation of the optically pumped VCSEL can be achieved through direct electrical modulation of the pump laser or an electric-absorption modulator.

Figure 1A:
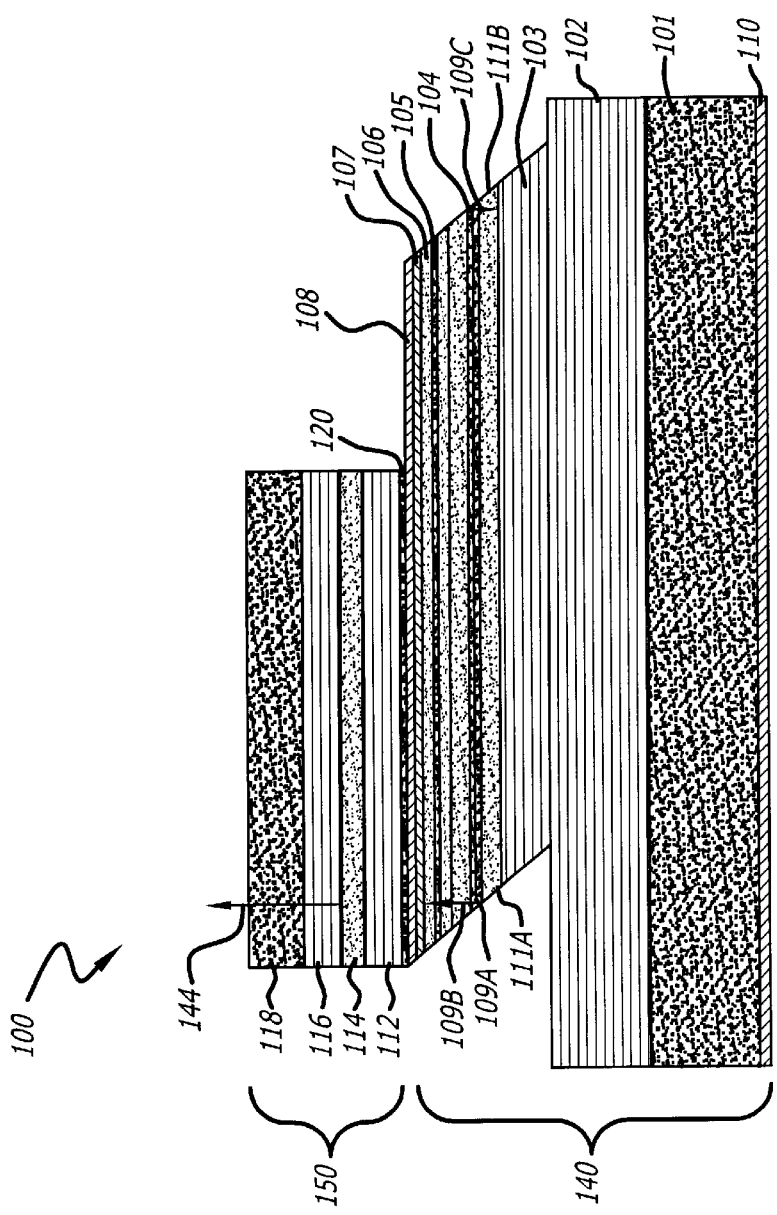
FIG. 1A is a magnified side view of an integrated optically pumped vertical cavity surface emitting laser.

Referring now to FIG. 1A, an integrated optically pumped VCSEL 100 is illustrated. The integrated optically pumped VCSEL 100 includes a folded cavity surface emitting laser (FCSEL) 140 integrated with an optically pumped VCSEL 150. The folded cavity surface emitting laser 140 includes a substrate 101, a distributed Bragg reflector (DBR) 102 (i.e., a mirror stack), an. active area or region 104, a confinement layer 105, a cladding layer 106, a semiconductor contact layer 107, a first metal layer as a top contact terminal 108, a second metal layer as a base terminal 110, and the facets or beam steering elements 111A and 111B.

Substrate 101 of the FCSEL 140 is preferably an n-type doped Gallium-Arsenide (GaAs) layer. Alternatively, the substrate 101 can be a layer of an n-type doped Indium-Phosphide (InP) or other semiconductor materials.

The DBP 102 is preferably doped to match the substrate 101. For example, in the case that the substrate 101 is an n-type doped Indium-Phosphide (InP) or Gallium-Arsenide (GaAs) substrate, the DBR 102 is n-type doped as well. The layers of the DBR 102 are preferably formed from n-type $Al_xGa_{1-x}As/Al_yGa_{1-y}As$ pairs of material with x ranging from 0 and 0.5, and y ranging from 0.5 and 1 for a GaAs substrate. The number of pairs may range from as few as five to as many as forty with the typical number of pairs being about twenty pairs of layers. Alternatively, an Indium-Aluminum-Gallium-Arsenide/Indium-Phosphide (InAlGaAs/InP) distributed Bragg Reflector (DBR), an Indium-Gallium-Arsenide-Phosphide/Indium-Phosphide (InGaAsP/InP) DBR, or other monolithic grown DBR mirror can be grown onto the substrate 101 if it is an InP substrate. If wafer bonding techniques are used, a Gallium-Arsenide/Aluminum-Gallium-Arsenide (GaAs/AlGaAs) distributed Bragg reflector (DBR) or a or dielectric DBR can be bonded to the substrate 101 and the active area or region 104. In the case of wafer bonding, the substrate 101 is preferably GaAs. Exemplary dielectric materials for a dielectric DBR include titanium di-oxide ($TiO_2$), silicon dioxide ($SiO_2$), and silicon nitrogen di-oxide ($SiNO_2$) The active area or region 104 can be a Gallium-Arsenide (GaAs), an Aluminum-Gallium-Arsenide (AlGaAs), or an Indium-Gallium-Arsenide (InGaAs) quantum well structure. The active area or region 104 of the FCSEL 140 in the preferred embodiment is a GaAs quantum well structure. The quantum well structure can be formed of a single quantum well or multiple quantum wells but in the preferred embodiment one to three quantum wells are utilized.

The cladding layer 106 of the FCSEL 140 is a p-type GaAs and can alternately be a p-type AlGaAs layer.

The confinement layer 105 of the FCSEL 140 is preferably an Aluminum-Gallium-Arsenide (AlGaAs) layer with aluminum content at larger than 90% and preferably larger than 95%. The Aluminum-Gallium-Arsenide (AlGaAs) layer 105 is formed within a part of the cladding 106 to allow lateral oxidation during device fabrication. Alternately, the confinement layer 105 is formed by oxidizing a portion of an Aluminum-Arsenide (AlAs) layer into an Aluminum-Oxide ($Al_2O_3$) region. The confinement layer 105 provides both current confinement and optical confinement for the FCSEL 140. Referring momentarily to FIG. 1B, the confinement layer 105 is oxidized to form a narrow conductive stripe above the active region 104 as illustrated.

The semiconductor contact layer 107 is provided so as to make an ohmic contact to the metal layer of the top contact terminal 108 deposited on its top surface. The semiconductor contact layer 107 is preferably a Gallium-Arsenide (GaAs) layer highly doped to be p-type semiconductor so as to provide an ohmic contact.

The first metal layer of the top contact terminal 108 forms a first terminal of the integrated optically pumped VCSEL 100. Referring momentarily to FIG. 1B, the metal layer for the top contact terminal 108 is only left deposited in certain areas of the semiconductor contact layer 107 so as not to block areas where photons are emitted or interfere with the coupling to the optically pumped VCSEL 150.

The second metal layer for the base terminal 110 is deposited on the bottom surface of the substrate 101 in order to form the second terminal of the integrated optically pumped VCSEL 100.

The FCSEL 140 is an electrically pumped semiconductor laser which has a folded laser cavity provided by a pair facets (also referred to as reflectors or beam-steering elements) 111A and 111B at opposite ends. Preferably the external-angled beam steering element 111B and the internal-angled beam steering element 111A are approximately forty five degree angles with the incident light to form the folded cavity of the folded cavity surface emitting laser 140. The beam steering elements 111A and 111B are preferably parallel to each other and formed by cleaving, etching, ion milling or other well known semiconductor process. The active area 104 of the FCSEL has the external-angled beam steering element 111B and the internal-angled beam steering element 111A formed from processing its material layers. The external-angled beam steering element 111B and the internal-angled beam steering element 111A may continue and be formed into the cladding 106, the contact layer 107, and a portion 103 of the DBR 102 as illustrated in the Figures. A dielectric coating (not shown) may be added to the facets 111A and 111B to act as a mirror coating to increase the reflectivity efficiency or as a surface passivation.

To manufacture the FCSEL 140, the layers of materials are first deposited or grown from the beginning layer of the substrate 101. After forming a monolithic structure consisting of the substrate 101, the DBR 102, the active region 104, the cladding layer 106 with the confinement layer 105, and the contact layer 107, the facets 111A and 111B can be formed. The facets 111A and 111B are formed by cleaving, etching, ion milling or other semiconductor process to remove material.

The optically pumped VCSEL 150 includes a first distributed Bragg reflector (DBR) (i.e., a first mirror stack) 112, a quantum well active area or region 114, a second distributed Bragg reflector (DBR) (i.e., a second mirror stack) 116, and a substrate 118. The first DBR 112 can be an $Al_xGa_{1-x}As/Al_yGa_{1-y}As$ DBR, an InP/InGaAsP DBR, or a dielectric DBR, and is preferably a dielectric DBR. The active area or region 114 can be InGaAsP, InAlGaAs, InGaAs, InGaAsN, or GaAsSb quantum well structure having multiple quantum wells. The second DBR 116 can be an $Al_xGa_{1-x}As/Al_yGa_{1-y}As$ DBR, an InGaAsP/InP DBR or a dielectric DBR, and is preferably made of pairs of InGaAsP/InP. The substrate 118 of the optically pumped VCSEL 150 can be a layer of GaAs or of Indium-Phosphide (InP), and is preferably an InP substrate. DBRs 112 and 116 are preferably made of thicknesses to provide substantial (preferably 99% or more) reflection of long wavelengths at 1.3 um or 1.55 um to amplify and stimulate emission. In FIGS. 1A and 1B, the folded cavity surface emitting laser 140 and the optically pumped VCSEL 150 are integrated together at the interface 120 by either fusing, gluing, metal bonding, epoxy bonding or other well-known semiconductor bonding methods. In this case, interface 120 represents the joining of the surfaces and a layer of material, if any, to join the surfaces. The interface 120 can alternately be an air gap in the case where the FCSEL 140 and the optically pumped VCSEL 150 are held mechanically aligned together.

In operation, the folded cavity-surface emitting laser 140 generates a short wavelength laser beam 109 which is reflected between the beam steering element 111A, beam steering element 111B, DBR 102, and the contact layer 107 as the laser beam elements 109A, 109B and 109C. The in-plane laser beam 109A is reflected by beam steering element 111A into the substantially perpendicular beam 109B for coupling into the VCSEL 150 to optically pump it. After becoming sufficiently pumped to reach lasing threshold, the optically pumped VCSEL 150 emits photons 144 preferably of a relatively long wavelength as a laser beam.

Figure 2A:
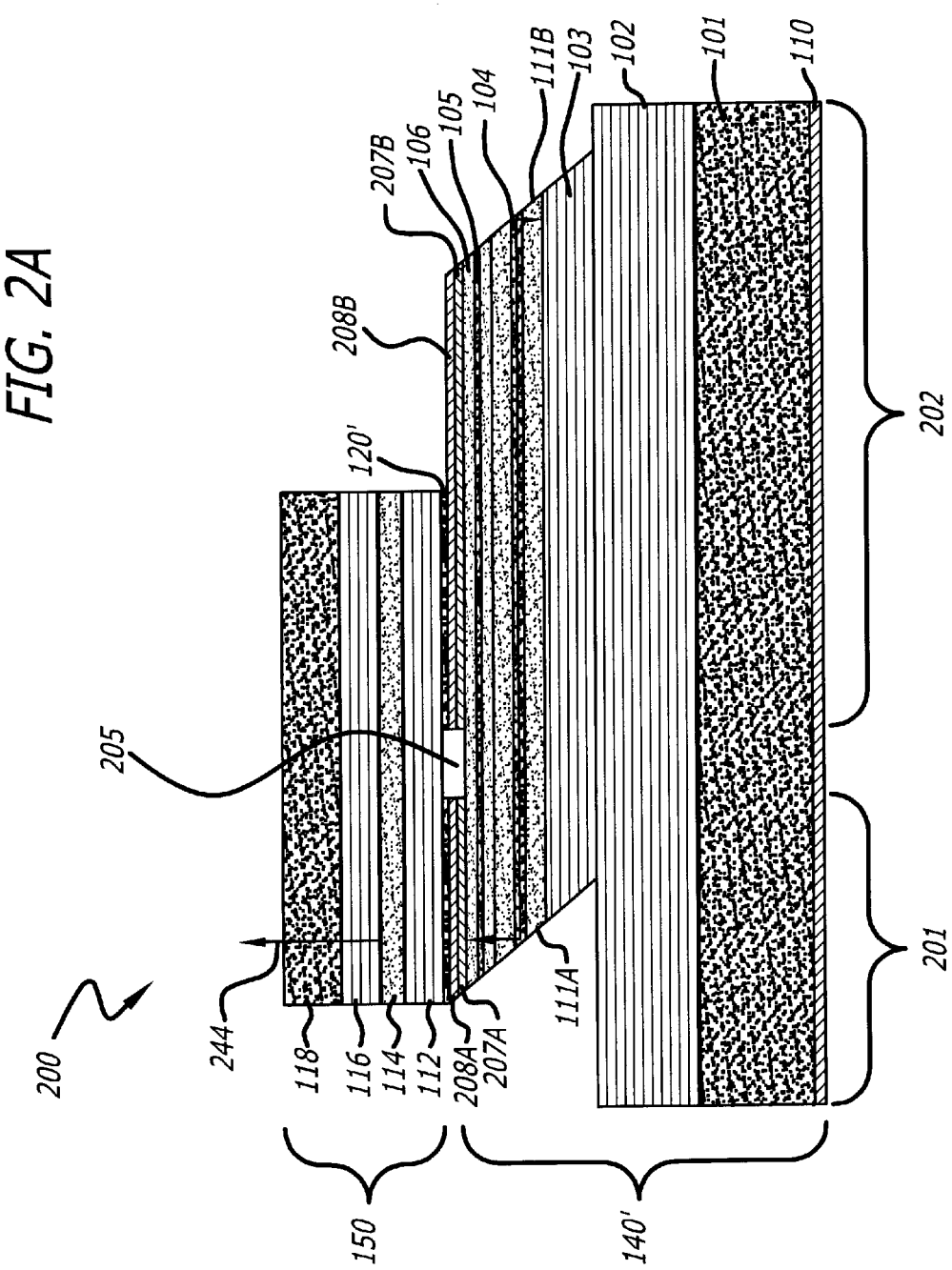
FIG. 2A is a magnified side view of an embodiment of the modulated integrated optically pumped VCSEL of the invention.

Referring now to FIG. 2A, a magnified side view of a modulated integrated optically pumped VCSEL 200 is illustrated. The modulated integrated optically pumped VCSEL 200 includes the VCSEL 150 and a two-section FCSEL 140'. But for those described below, the elements of optically pumped VCSEL 150 are the same as those described with reference to FIGS. 1A–1B and are not repeated here. The two-section FCSEL 140' is similar to FCSEL 140 except that the two-section FCSEL 140' is separated into two sections, a first section 201 and a second section 202 by a gap 205. The gap 205 may be an airgap or a gap filed with an insulative or dielectric material. The gap 205 separates the semiconductor contact layer 107 of FCSEL 140 into two sections, semiconductor contact layer 207A and semiconductor contact layer 207B of FCSEL 140' in FIG. 2A. Each of the sections 201 and 202 also has its own separate contact terminal, first contact terminal 208A and second contact terminal 208B respectively, which are formed out of a deposited metal layer in the desired contact area. The separate contact terminals 208A and 208B provide for separate control of the FCSEL 140'. The gap 205 essentially forms two separate sections, first section 201 and second section 202, of the FCSEL 140'. The first section 201 of the FCSEL 140' is separately controlled by the first contact terminal 208A. The second section 202 of the FCSEL 140' is separately controlled by the second contact terminal 208B. Interface 120' couples FCSEL 140' to the VCSEL 150 and is formed similarly to interface 120 of FIGS. 1A–1B but for the gap 205.

The second section 202 of the FCSEL 140' is DC biased, while the first section 201 of the FCSEL 140' is modulated by data at a data rate, or alternatively the first section 201 can be DC biased while the second section 202 is modulated by data at a data rate. The two sections, the first section 201 and the second section 202, are controlled in such a way that the FCSEL 140' is always "on" and generating photons at one power level. When the first section 201 is "off", the second section 202 is controlled so that the pump power of the FCSEL 140' generates photons having a power level at or slightly above the lasing threshold of the optically pumped VCSEL 150. The second section 202 in this case is said to be at a threshold biased state. In this case, VCSEL 150 does not lase or minimally lases with emitted photons 244 being of a low power level and therefore can be considered turned "off". When the first section 201 is "on" in combination with the second section 202 being in a threshold biased state, the combined pump power from the first section 201 and the second section 202 of the FCSEL 140' generate photons of a second power level exceeding the threshold pump power of the VCSEL 150 so that it lases and emits photons 244. In this case, VCSEL 150 can be considered turned "on" when it lases and emits photons 244. Optically pumped VCSEL 150 is preferably a long wavelength optically pumped VCSEL to generate photons 244 at a relatively long wavelength such as 1300 nm. The elements of the optically pumped VCSEL 150 are the same as those described with respect to FIGS. 1A–1B and are not repeated here.

Figure 2B:
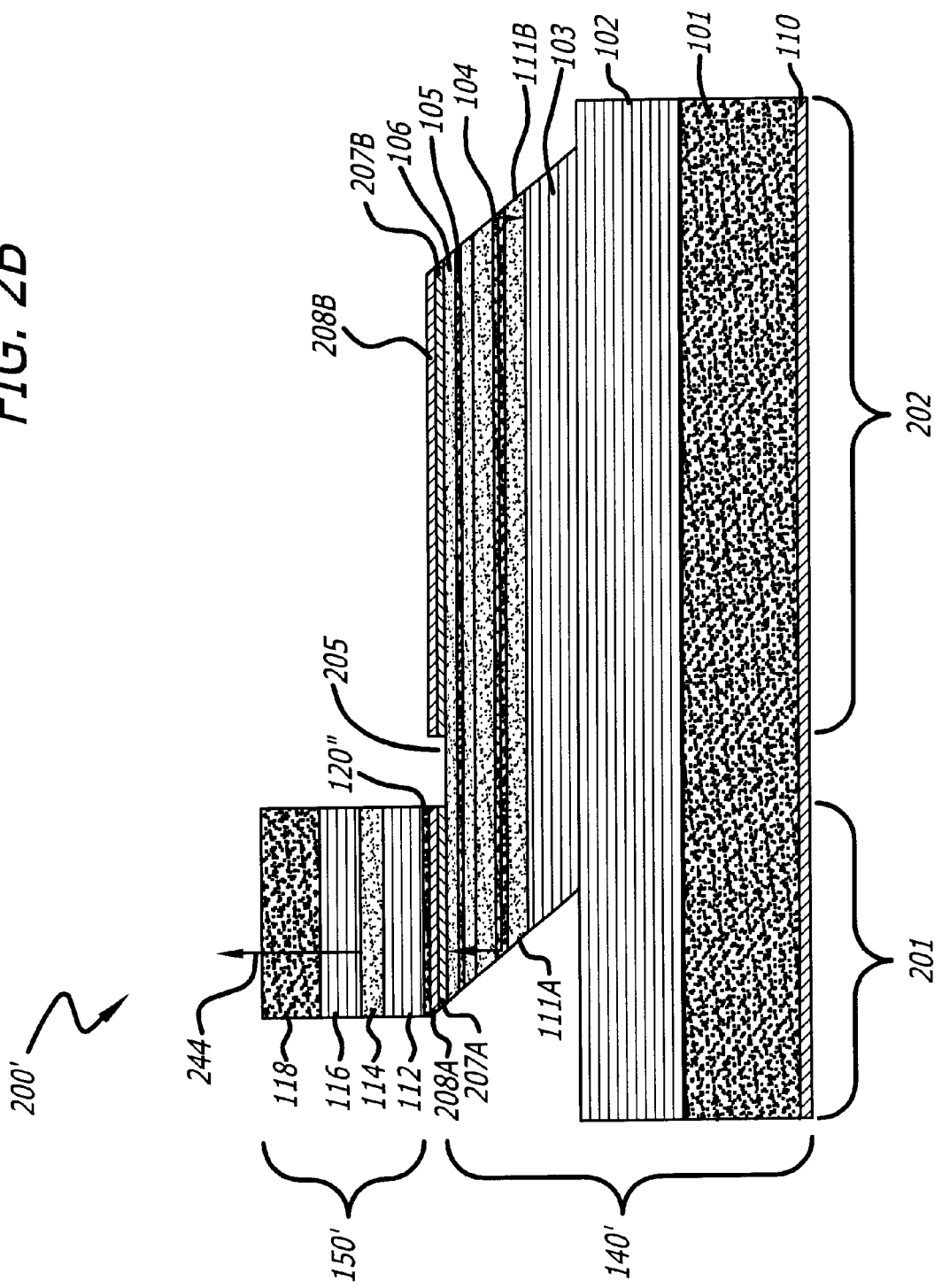
FIG. 2B is a magnified side view of another embodiment of the modulated integrated optically pumped VCSEL of the invention.

Referring now to FIG. 2B, a magnified side view of a modulated integrated optically pumped VCSEL 200' is illustrated. The modulated integrated optically pumped VCSEL 200' of FIG. 2B is similar to the modulated integrated optically pumped VCSEL 200 of FIG. 2A except that an unnecessary portion of the optically pumped VCSEL 150 is removed. Optically pumped VCSEL 150' is smaller that the optically pumped VCSEL 150 and utilizes semiconductor materials more efficiently. Additionally, the modulated integrated optically pumped VCSEL 200' can have a larger surface contact for the metal contact terminal 208B. VCSEL 200' retains the gap 205 to split the FCSEL 140' into two sections, the first section 201 and the second section 202. Alternatively, gap 205 may be larger or formed differently due to the fact the portion of the optically pumped VCSEL 150' is not covering the gap as in FIG. 2A.

In operation of the modulated integrated optically pumped VCSEL 200 or 200', a data modulated waveform is coupled into the first contact terminal 208A to modulate the FCSEL 140' and thereby modulate the optically pumped VCSEL 150 to emit photons 244 or not emit photons 244. A threshold bias signal is coupled into the second contact terminal 208B while a reference level is coupled into the base terminal 110. While a voltage waveform is supplied between the first contact terminal 208A and the base terminal 110 and between the second contact terminal 208B and the base terminal 110, currents generated thereby in the FCSEL 140' actually form the threshold bias and modulate the FCSEL 140' into the emission of high or low energy photons into the optically pumped VCSEL 150.

Referring now to FIG. 3A, a magnified cross-sectional side view of a modulated integrated optically pumped VCSEL 300 is illustrated. The modulated integrated optically pumped VCSEL 300 includes a FCSEL 140" and the optically pumped VCSEL 150 as illustrated in FIGS. 3A–3B. The material layers of the modulated integrated optically pumped VCSEL 300 of FIGS. 3A–3B are the same as those of the integrated optically pumped VCSEL 100 unless discussed below and are otherwise not repeated here for brevity. A wafer of optically pumped VCSELs 150 and a wafer of FCSELs 140 are initially formed in the manufacture of the modulated integrated optically pumped VCSEL 300 and joined together. To further manufacture the VCSEL 300, portions of material layers are removed. The substrate 101 (not shown in FIG. 3A) used to initially form the FCSEL 140" is removed from the VCSEL 300. In comparison with FIGS. 1, 2A, and 2B, a portion of the DBR 102 of the FCSEL is removed, including a gap 305, to form a first DBR section 312A and a second DBR section 312B.

Initially before the removal of materials, wafer boding is used to join together in alignment, the optically pumped VCSELs 150 in a wafer format with the FCSELs 140 in a wafer format. The device fabrication process of the modulated integrated optically pumped VCSELs 300 starts from the exposed substrate 101 of the FCSELs 140 in the joined wafers. First the substrate 101 is removed and a portion of the DBR 102 of the FCSELs is removed, including a gap 305, to form a first DBR section 312A and a second DBR section 312B of the FCSELs 140". A metal layer is then deposited in two desired contact terminal areas onto the first DBR section 312A and the second DBR section 312B to form a first contact terminal 310A and a second contact terminal 310B. On the FCSEL side of the joined wafers, sufficient portions of FCSEL material layers are etched away to expose an area of the semiconductor contact layer 107 for making p-type electrical contact from the same side as the n-type metal contacts. A metal layer is then deposited onto desired areas of the semiconductor contact layer 107 to form the p-contact terminal 308 and the DBR sections 312A and 312B to form the n-contact terminals 310A and 310B respectively. Referring now to FIG. 3B, the p-contact terminal 308 couples to the semiconductor contact layer 107 and the n-contact terminal 310B couples to the DBR section 312B as illustrated. The p-contact terminal 308 extends across the first section 301 and the second section 302 of the FCSEL 140".

FCSEL 140" is a sectional FCSEL having the first section 301 and the second section 302 formed by the gap 305. The gap 305 may be an airgap or a gap filled with an insulative or dielectric material. The gap 305 separates the DBR 102 of FCSEL 140 into two sections, a first DBR section 312A and a second DBR section 312B of the FCSEL 140". Each of the DBR sections 312A and 312B also has its own separate metal contact terminal, first contact terminal 310A and second contact terminal 310B respectively, which are formed out of a deposited metal layer in the desired contact area. The separate contact terminals 310A and 310B provide for separate control of the FCSEL 140". The first section 301 of the FCSEL 140" is separately controlled by the first contact terminal 310A. The second section 302 of the FCSEL 140" is separately controlled by the second contact terminal 310B.

The second section 302 of the FCSEL 140" is DC biased, while the first section 301 of the FCSEL 140" is modulated by data at a data rate, or alternatively the first section 301 can be DC biased while the second section 302 is modulated by data at a data rate. The first section 301 and the second section 302 are controlled in such a way that the FCSEL 140" is always "on" and generating photons but not necessarily at the same power level. When the first section 301 is "off", the second section 302 is controlled so that the pump power of the FCSEL 140" generates photons having a power level at the lasing threshold of the optically pumped VCSEL 150. The second section 302 is said to be at a threshold biased state. In this case, VCSEL 150 does not lase or minimally lases with emitted photons 344 being of a low power level and therefore can be considered turned "off". When the first section 301 is "on" in combination with the second section 302 being in a threshold biased state, the combined pump power from the first section 301 and the second section 302 of the FCSEL 140" is at a level exceeding the threshold pump power of the VCSEL 150 so that it lase and emits photons 344. In this case, VCSEL 150 can be considered turned "on" when it lases and emits photons 344.

In operation, a data modulated waveform is coupled into the first contact terminal 310A to modulate the FCSEL 140" and thereby modulate the optically pumped VCSEL 150 to emit photons 344 or not emit photons 344. A threshold bias signal is coupled into the second contact terminal 310B while a reference level is coupled into the contact terminal 308. While a voltage or current waveform is supplied between the first contact terminal 310A and the contact terminal 308 and between the second contact terminal 310B and the contact terminal 308, currents generated thereby in the FCSEL 140" actually form the threshold bias and modulate the FCSEL 140" into the emission of high or low energy photons into the optically pumped VCSEL 150.

In the embodiments illustrated in FIGS. 2A, 2B, and 3A–3B of the invention, the pump laser is split into two sections. In FIGS. 2A and 2B, FCSEL 140' is split into the first section 201 and the second section 202 by a gap 205. In FIGS. 3A–3B, FCSEL 140" is split into the first section 301 and the second section 302. The parasitics as seen from the point of view of the electrical connections to the pump laser are also split in two. As a result, the dynamic parasitics associated with data modulation of the first section 201 through the first contact terminal 208A and of the first section 301 through the first contact terminal 310A are reduced from that of modulating the top contact terminal 108 of FIGS. 1A–1B. The dynamic parasitic reduction at the first contact terminal 208A is because only a small section of the pump FCSEL 140', the first section 201, needs to be modulated. The dynamic parasitic reduction at the first contact terminal 310A is because only a small section of the pump FCSEL 140", the first section 301, needs to be modulated. With a low level of dynamic parasitics at the pump laser, higher pump modulation frequencies can be obtained. The higher pump modulation frequencies enable a higher modulation frequency in the optically pumped VCSEL 150 and 150' as well.

Referring now to FIG. 4, a magnified side view of a modulated integrated optically pumped VCSEL 400 is illustrated. The modulated integrated optically pumped VCSEL 400 which is the preferred embodiment includes an electrically pumped surface emitting laser, the optically pumped VCSEL 150 and a surface integrated electric-absorption (EA) modulator 405 sandwiched there-between along with the interface 120'". The electrically pumped surface emitting laser can be an electrically pumped in-plane surface emitting laser, an electrically pumped grating surface emitting laser, an electrically pumped VCSEL, or an electrically pumped FCSEL 140 as shown in FIG. 4. The elements of the material layers of the FCSEL 140 and the VCSEL 150 of the modulated integrated optically pumped VCSEL 400 are the same as those described with reference to FIGS. 1A–1B and are not repeated herein for brevity.

The electric-absorption (EA) modulator 405 is formed of multiple quantum wells sandwiched between cladding layers and contact layers. The optically pumped VCSEL 150 is coupled to the EA modulator 405 through the interface 120'''. Interface 120''' is formed similarly to interface 120 of FIGS. 1A–1B. The EA modulator 405 couples to the semiconductor contact layer 107 of the electrically pumped FCSEL 140. The EA modulator 405 is used to modulate the light or photons generated by the electrically pumped FCSEL 140 before they are coupled into the optically pumped VCSEL 150. The EA modulator 405 acts similar to a shutter of a still camera. In the "on" state, the photons generated by the electrically pumped FCSEL 140 is transmitted through the EA modulator 405 into the optically pumped VCSEL 150 without being absorbed. In the "off" state, the EA modulator 405 is highly absorptive and attenuates the photons emitted by the electrically pumped FCSEL 140 before they reach the optically pumped VCSEL 150. The EA modulator 405 includes contact terminals 410 and 408 for modulation control. A modulated voltage is provided between the contact terminals 410 and 408 to modulate the modulated integrated optically pumped VCSEL 400. The modulated voltage is generated in response to a desired data modulation signal and causes the EA modulator 405 to attenuate photons at one voltage level and allow them to pass at another voltage level.

The parasitics associated with modulating the EA modulator 405 are minimal such that modulation of the optically pumped VCSEL can occur at high frequencies. The EA modulator 405 inherently has chirping but does not effect the optically pumped VCSEL 150. The optically pumped VCSEL 150 is relatively insensitive to variations of the input pump wavelength. The EA modulator 405 may have a poor extinction ratio of photons but this does not pose a problem for the modulated integrated optically pumped VCSEL 400. This is because it is not necessary to completely turn off the electrically pumped FCSEL 140 during an "off" state in order that photons 444 are not emitted. The pump power need only be maintained at or near the threshold pump level of the optically pumped VCSEL 150 so that photons 444 are not emitted. Essentially the modulation frequency of the modulated integrated optically pumped VCSEL 400 is limited only by the carrier transport and the thermionic emission effect of the optically pumped VCSEL 150.

Figure 5A:
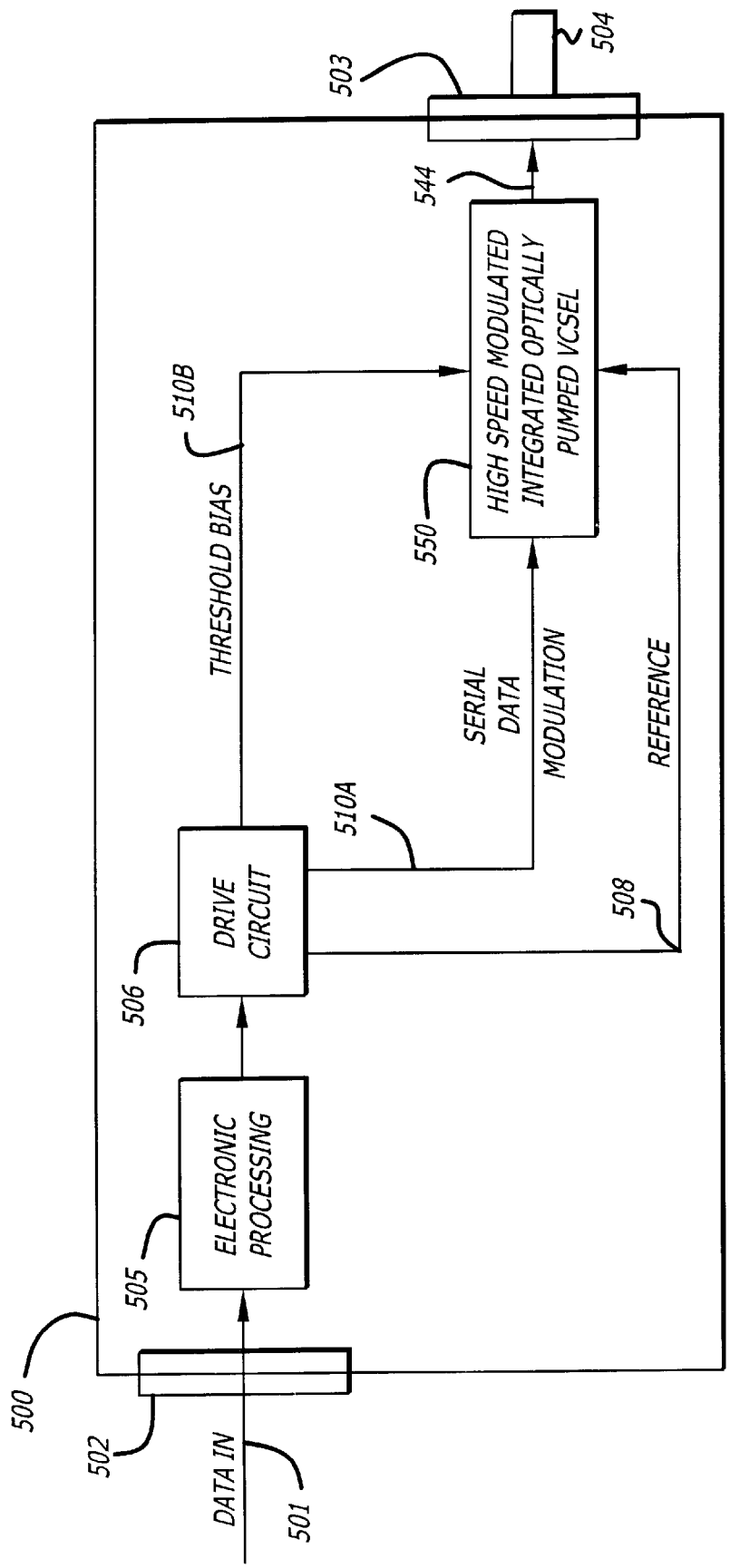
FIG. 5A is a block diagram of a system for modulating the modulated integrated optically pumped VCSELs of FIG. 2A, FIG. 2B, and FIG. 3A–3B.

Referring now to FIG. 5A, a block diagram of a system 500 for modulation of the embodiments of the modulated integrated optically pumped VCSELs 200, 200', and 300 is illustrated. The system 500 receives a data input 501 through an electronic interface 502 such as a wire, cable, or pins. By means of an optical interface 503, such as a collimating lens or fiber pigtail, the system 500 couples to an optical fiber 504. Drive circuitry 506 generates the proper drive currents for a serial data modulation signal 510A and a threshold bias signal 510B with respect to the reference 508. The serial data modulation signal 510A and the threshold bias signal 510B are respectively coupled to terminals 208A and 208B of VCSEL 200, terminals 208A and 208B of VCSEL 200', or terminals 310A and 310B of VCSEL 300.

The reference signal 508 of the drive circuitry 506 is coupled to the base terminal 110 of VCSEL 200 and VCSEL 200', and top contact terminal 308 of VCSEL 300.

Figure 5B:
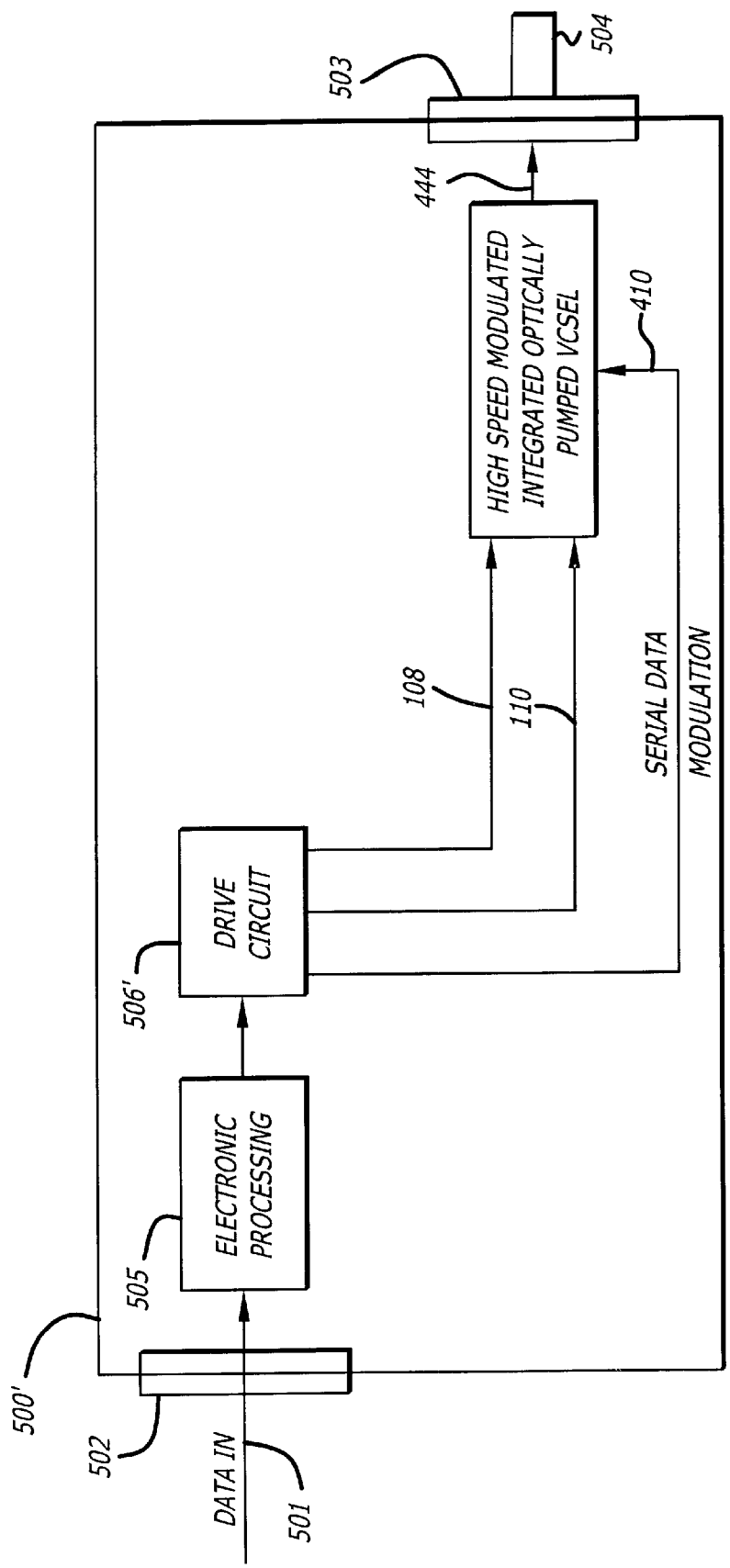
FIG. 5B is a block diagram of a system for modulating the modulated integrated optically pumped VCSEL of FIG. 4.

Referring now to FIG. 5B, a block diagram of a system 500' for modulation of the preferred embodiment of the modulated integrated optically pumped VCSEL 400 is illustrated. System 500' is similar to system 500 but for drive circuitry 506' which generates a varying voltage between the serial data modulation terminals 410 and 408 of the EA modulator 405. The drive circuitry 506' also provides a voltage or current across terminals 408 and 110 for the FCSEL 140 of the modulated integrated optically pumped VCSEL 400.

In embodiments of the modulated integrated optically pumped laser diode disclosed herein, the turn-on delay can be minimized by maintaining the pump laser, the electrically pumped FCSEL, in a biased state generating photons with its power at or slightly above the optically pumped VCSEL threshold. Jitter is minimized in the embodiments as well forth is same reason because the pump laser, the electrically pumped FCSEL, is maintained in a biased state constantly generating photons. Chirping was minimized in the embodiments of modulated integrated optically pumped VCSELs 200, 200', 300 and 400 because the VCSEL is relatively insensitive to the pump wavelength variation.

Referring now to FIGS. 6A–6C, an integrated optically pumped vertical cavity surface emitting laser 600 is illustrated. The integrated optically pumped VCSEL 600 can generate a long wavelength output 601. The integrated optically pumped VCSEL 600 includes a silicon (Si) bench 602, an edge emitting laser diode (EELD) 604 and a vertical cavity surface emitting laser (VCSEL) 606. The VCSEL 606 is optically pumped by the EELD 604. In one embodiment of the invention VCSEL 606 is index guided. The VCSEL 606 includes a first distributed Bragg reflector (i.e., a first mirror stack) 610, an active area or region 612 including quantum well structures, and a second distributed Bragg reflector (i.e., a second mirror stack) 614.

The silicon bench 602 couples to the VCSEL 606 at a bonding interface 608. The EELD 604 and the VCSEL 606 may be formed together in one embodiment. In another embodiment, the EELD 604 couples to the VCSEL 606 at a bonding interface 6081. In yet another embodiment, the EELD 604 can be formed together with the upper layers of the VCSEL 606 such as the second distributed Bragg reflector 614 with a bonding interface between the second distributed Bragg reflector 614 and the active area or region 612. Additionally, the active area or region 612 and the first distributed Bragg reflector 610 can be coupled together at a bonding interface instead of being grown together. The bonding interface 608 and others can include wafer bonding, metal bonding, glue, epoxy or other known semiconductor wafer bonding types.

As previously mentioned, the VCSEL 606 includes the first distributed Bragg reflector 610, the active area or region 612 including quantum well structures, and the second distributed Bragg reflector 614. The layers of the first and second distributed Bragg reflectors 610 and 614 are formed of alternating layers of high refractive index material and low refractive index material preferably formed of $Al_xGa_{1-x}As/Al_yGa_{1-y}As$ pairs of material with x ranging from 0 and 0.5, and y ranging from 0.5 and 1 for a GaAs substrate. The number of pairs may range from as few as five to as many as forty with the typical number of pairs being about twenty pairs of layers. Additionally, either one or both of the first and second distributed Bragg reflectors 610 and 614 may be formed of dielectric coatings. The active area or region 612 can be a Gallium-Indium-Nitride-Arsenide (GaInNAs), an Gallium-Arsenide-Antimony (GaAsSb), or an Indium-Gallium-Arsenide (InGaAs) quantum well or quantum dot (QD) structure. Alternatively, the active area or region 612 can be formed of InAlGaAs or InGaAsP, and wafer bonded onto first and second distributed Bragg reflectors 610 and 614. The quantum well structure can be formed of a single quantum well or multiple quantum wells with one to ten quantum wells typically being utilized.

In the case where the VCSEL 606 is index guided, a number of index guiding techniques may be used. In one embodiment, the second DBR 614 includes a mesa area or region 616 with an air-gap cylindrical shaped area or region 618 surrounding the mesa area 616. The mesa area 616 may also be referred to as a pillar or a pedestal. The mesa area 616 can be formed by etching the second DBR 614 and forming the air gap 618. In one embodiment, the diameter of mesa area 616 is typically in the range of five to twenty microns. The mesa 616 and the air gap 618 index guide the photons in the optically pumped vertical cavity surface emitting laser 606. The difference in the index of refraction of the air gap 618 and the index of refraction of the DBR 614 guides the photons functioning as a wave guide. Alternatively, the mesa 616 can be surrounded by dielectric materials in the air gap 618 for protection. Part of the mesa 616 may undercut inward by oxidizing partial layers of the second distributed Bragg reflector (DBR) 614. U.S. patent application Ser. No. 09/400,359, filed Sep. 20, 1999 by inventors Wenbin Jiang et al discloses additional means of index guiding that can be applied to the invention and is incorporated herein by reference.

The silicon bench 602 couples to the VCSEL 606 and has a width similar to that of the VCSEL 606 as illustrated in FIG. 6B. The silicon bench 602 is a beam steering element and has a forty-five degree angle facet 620 which is used to steer photons in the pump beams 631 from the EELD 604 to the VCSEL 606. The lower edge of the facet 620 aligns with an edge of the air gap 618 in the embodiment of the index guided VCSEL. The silicon bench includes a second facet 622 to avoid an extension of the silicon bench over the EELD 604. The silicon bench 602 is formed of silicon but can be replaced by other materials to provide a similar function. In one embodiment, the silicon of the silicon bench 602 is replaced with a molded or spin-coated polymer materials, such as SU-8 photoresist. Additionally, the facet 620 may be reflectively coated at the desired wavelength of the pump beam 631.

The EELD 604 couples to the VCSEL 606. The EELD 604 can be formed separately from the VCSEL 606 and then coupled thereto by typical wafer bonding methods in one embodiment. To facilitate wafer bonding, alignment marks can be included on the VCSEL 606. Alternatively, the EELD 604 can be integrally formed with the VCSEL 606 through semiconductor processing methods. In one embodiment the waveguide width of the EELD 604 falls within the diameter of the cylinder of the air gap 618 as illustrated in FIGS. 6B and 6C. In this case, the pump beams 631 are more focused into the mesa area 616 of the second DBR 614 and the active area or region 612. The EELD 604 is electrically pumped to generate photons for the VCSEL 606. The EELD 604 in one embodiment is a GaAs based edge emitting laser emitting photons at a wavelength shorter than the desired wavelength of photon emission of the optically pumped VCSEL 606.

The EELD 604 when electrically pumped generates photons or light of a relatively short wavelength over the range from 650 nm through 1100 nm. In preferred embodiments, the EELD 604 will emit photons at 850 nm or 980 nm in wavelength. By proper selection of the layers, the VCSEL 606 can be formed to generate photons of a relatively longer wavelength around 1310 nm or around 1550 nm when optically pumped.

Referring now to FIGS. 7A–7C, an integrated optically pumped vertical cavity surface emitting laser 700 is illustrated. The integrated optically pumped VCSEL 700 can generate a long wavelength output 701. The integrated optically pumped VCSEL 700 is a folded cavity surface emitting laser FCSEL includes an edge emitting laser diode (EELD) 704 with a folded cavity and a vertical cavity surface emitting laser (VCSEL) 706. The VCSEL 706 in one embodiment is index guided. The edge emitting laser diode (EELD) 704 and the vertical cavity surface emitting laser (VCSEL) 706 are grown together in an integrated process such that no wafer bonding techniques need be used.

The VCSEL 706 includes a first distributed Bragg reflector (i.e., a first mirror stack) 710, an active area or region 712 including quantum well structures, and a second distributed Bragg reflector (i.e., a second mirror stack) 714. The layers of the first and second distributed Bragg reflectors 710 and 714 are preferably formed of $Al_xGa_{1-x}As/Al_yGa_{1-y}As$ pairs of material with x ranging from 0 and 0.5, and y ranging from 0.5 and 1 for a GaAs substrate. The number of pairs may range from as few as five to as many as forty with the typical number of pairs being about twenty pairs of layers. The active area or region 712 can be a Gallium-Indium-Nitride-Arsenide (GaInNAs), an Gallium-Arsenide-Antimony (GaAsSb), or an Indium-Gallium-Arsenide (InGaAs) quantum well or quantum dot (QD) structure. The quantum well structure can be formed of a single quantum well or multiple quantum wells with one to ten quantum wells typically. being utilized. Alternatively, the active area or region 712 may be InAlGaAs or InGaAsP and wafer bonded onto either or both the first and second DBRs 710 and 714.

The EELD 704 is formed such that when electrically pumped it generates photons or light of a relatively short wavelength in a the range from 650 nm through 1100 nm. In preferred embodiments, the EELD 704 will emit photons at 850 nm or 980 nm in wavelength. By proper selection of the layers, the VCSEL 706 can be formed to generate photons 701 of a relatively long wavelength of around 1310 nm or around 1550 nm when optically pumped.

In the case where the VCSEL 706 is index guided, a number of index guiding techniques may be used. In one embodiment, the second DBR 714 includes a mesa area 716 with an air gap 718 surrounding the mesa area 716. The air gap 718 is a cylindrical trench in the second DBR 714. The mesa area 716 may also be referred to as a pillar or a pedestal. The mesa area 716 can be formed by etching a trench in the second DBR 714 and forming the air gap 718. In one embodiment, the diameter of mesa area 716 is typically larger than thirty microns. A layer of the second DBR 714 is oxidized from the air gap 718 to form an oxide layer 730 in the mesa 716. The oxide layer 730 has a hollow cylindrical shape similar to a washer with a center region 731 of the second DBR 714 not being oxidized. In one embodiment, the diameter of center region 731 is typically in the range of five to twenty microns. The oxide cylindrical shaped area 730 index guides the photons in the optically pumped vertical cavity surface emitting laser 706. The difference in the index of refraction of the oxide cylindrical shaped area 730 and the index of refraction of the DBR 714 guides the photons functioning as a waveguide.

The oxide layer 730, also sometimes referred to as a confinement layer, is preferably formed in an Aluminum-Gallium-Arsenide (AlGaAs) layer of the DBR having an aluminum content greater than 90% and preferably 95% or more. The Aluminum-Gallium-Arsenide (AlGaAs) layer is formed within a part of the DBR 714 to allow lateral oxidation during device fabrication in forming the oxide layer 730. Alternately, the oxide layer 730 can be formed by oxidizing a portion of an Aluminum-Arsenide (AlAs) layer into an Aluminum-Oxide ($Al_2O_3$) region. The oxide layer 730 provides weak optical confinement for the VCSEL 706.

The oxide layer 730 is formed above the active region.712 as illustrated in FIGS. 7A and 7B to form some minor index difference for optical waveguiding.

The EELD-704 includes a facet 720 to provide the folded cavity for it and the VCSEL 706 to form a folded cavity surface emitting laser (FCSEL). In one embodiment, the facet 720 has an angle of forty five degrees. The facet 720 is a beam steering element that steers the horizontal beam of the edge emitting laser into a vertical beam which is coupled into the VCSEL 706. The waveguide width of the EELD 704 falls within the diameter of the mesa region 716 of the second DBR 714 as illustrated in FIGS. 7B and 7C. In this case, the pump beams 731 are more focused into the center region 731 of the mesa area 716 of the second DBR 714. The EELD 704 is electrically pumped to generate photons for the VCSEL 706 and modulated to generate a modulated output.

Referring now to FIGS. 8A–8C, an integrated optically pumped vertical cavity surface emitting laser 800 is illustrated. The integrated optically pumped VCSEL 800 can generate a long wavelength output 801. The integrated optically pumped VCSEL 800 includes an external beam steering mirror 802, an edge emitting laser diode (EELD) 804 and a vertical cavity surface emitting laser (VCSEL) 806. The VCSEL 806 in one embodiment is index guided. The edge emitting laser diode (EELD) 804 and the vertical cavity surface emitting laser (VCSEL) 806 are grown together in an integrated process such that no wafer bonding techniques need be used. The external beam steering mirror 802 preferably is formed of polymer materials, such as SU-8 photoresist or other similar material that can be grown or deposited onto the surface of a wafer without using wafer bonding techniques. In other embodiments, the external beam steering mirror 802 is a molded plastic or other material that requires wafer bonding techniques.

The VCSEL 806 includes a first distributed Bragg reflector (i.e., a first mirror stack) 810, an active area or region 812 including quantum well structures, and a second distributed Bragg reflector (i.e., a second mirror stack) 814. The layers of the first and second distributed Bragg reflectors 810 and 814 are preferably formed of $Al_xGa_{1-x}As/Al_yGa_{1-y}As$ pairs of material with x ranging from 0 and 0.5, and y ranging from 0.5 and 1 for a GaAs substrate. The number of pairs may range from as few as five to as many as forty with the typical number of pairs being about twenty pairs of layers. The active area or region 812 can be a Gallium-Indium-Nitride-Arsenide (GaInNAs), an Gallium-Arsenide-Antimony (GaAsSb), or an Indium-Gallium-Arsenide (InGaAs) quantum well or quantum dot (QD) structure. The quantum well structure can be formed of a single quantum well or multiple quantum wells with one to ten quantum wells typically being utilized. Alternatively, InAlGaAs or InGaAsP may be used as layers in the active area or region 812 and GaAs based first and second DBR mirrors 812 and 814 can be wafer bonded thereto sandwiching the active area or region 812.

The EELD 804 is formed such that when electrically pumped it generates photons or light of a relatively short wavelength in a the range from 650 nm through 1100 nm. By proper selection of the layers, the VCSEL 806 can be formed to generate photons 801 of a relatively long wavelength of around 1310 nm or around 1550 nm when optically pumped.

In the case where the VCSEL 806 is index guided, a number of index guiding techniques may be used. In one embodiment, the second DBR 814 includes a mesa area 816 with an air gap 818 surrounding the mesa area 816. The air gap 818 is a cylindrical trench in the second DBR 814. The mesa area 816 may also be referred to as a pillar or a pedestal. The mesa area 816 can be formed by etching a trench in the second DBR 814 and forming the air gap 818. In one embodiment, the diameter of mesa area 816 is typically larger than thirty microns. A layer of the second DBR 814 is oxidized from the air gap 818 to form an oxide layer 830 in the mesa 816. The oxide layer 830 has a hollow cylindrical shape similar to a washer with a center region 831 of the second DBR 814 not being oxidized. In one embodiment, the diameter of center region 831 is typically in the range of five to ten microns. The mesa 816 and the oxide cylindrical shaped area 830 index guide the photons in the optically pumped vertical cavity surface emitting laser 806. The difference in the index of refraction of the oxide cylindrical shaped area 830 and the index of refraction of the DBR 814 guides the photons functioning as a wave guide.

The oxide layer 830, also sometimes referred to as a confinement layer, is preferably formed in an Aluminum-Gallium-Arsenide (AlGaAs) layer of the DBR having an aluminum content greater than 90% and preferably 95% or more. The Aluminum-Gallium-Arsenide (AlGaAs) layer is formed within a part of the DBR 814 to allow lateral oxidation during device fabrication. Alternately, the oxide layer 830 can be formed by oxidizing a portion of an Aluminum-Arsenide (AlAs) layer into an Aluminum-Oxide $(Al_2O_3)$ region. The oxide layer 830 provides weak optical confinement for the VCSEL 806. The oxide layer 830 is formed above the active region 812 as illustrated in FIGS. 8A and 8B to form some minor index difference for optical waveguiding.

The external beam steering mirror 802 includes a facet 820 which may be etched or cut out of the beam steering material or otherwise molded or formed by photolithography technology. In one embodiment, the facet 820 has an angle of forty five degrees. The facet 820 provides beam steering to steer the horizontal beam of the edge emitting laser diode 804 into a vertical beam which is coupled into the VCSEL 806. The waveguide width of the EELD 804 falls within the diameter of the mesa region 816 of the second DBR 814 as illustrated in FIGS. 8B and 8C. In this case, the pump beams 831 are more focused into the center region 831 of the mesa area 816 of the second DBR 814. The EELD 804 is electrically pumped to generate photons for the VCSEL 806 and modulated to generate a modulated output.

In forming the integrated optically pumped VCSELs, the process can be integrated in that only one wafer is used or the processing can be separated and wafer bonding techniques used to join the components. The costs of manufacturing may determine which method of forming an integrated optically pumped VCSEL is selected. In one embodiment, methods of semiconductor manufacturing can be utilized to form some or all of the components of the integrated optically pumped VCSEL. For example, an edge emitting laser diode and a VCSEL can be formed together on the same wafer and then a beam steering element can be wafer bonded onto the VCSEL to form an array of integrated optically pumped VCSEL. The array can be separated or alternately each individual integrated optically pumped VCSEL in the array can be controlled to generate an array of laser outputs.

Figure 9A:
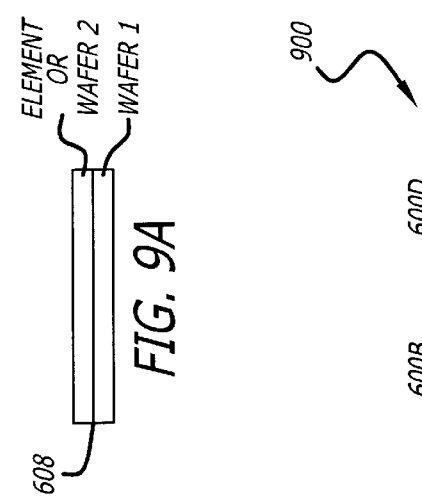
FIG. 9A is a magnified side view of exemplary wafer bonding techniques.

Referring now to FIG. 9A, a first wafer (wafer 1) has a second wafer (wafer 2) or an element of a second wafer bonded to its surface. The wafer bonding can occur at the interface: 608 and/or 608' or other bonding interfaces previously described. The wafer bonding can be a metal bonding, a glue, or other well known wafer bonding technique.

Figure 9D:
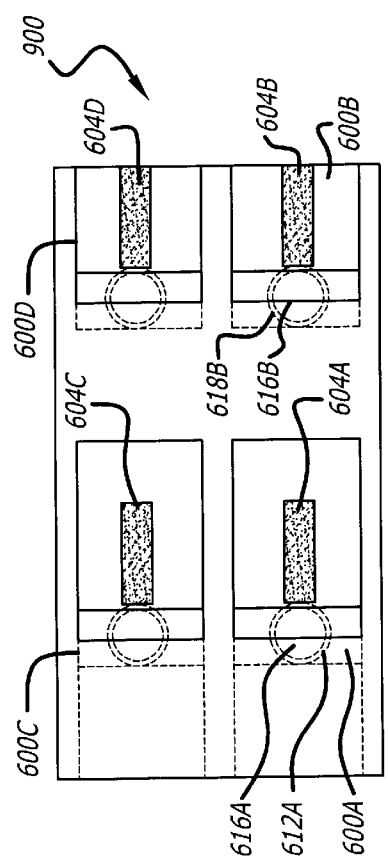
FIG. 9D is a magnified cross-sectional front view of the integrated optically pumped vertical cavity surface emitting laser of FIG. 9B.
Figure 9C:
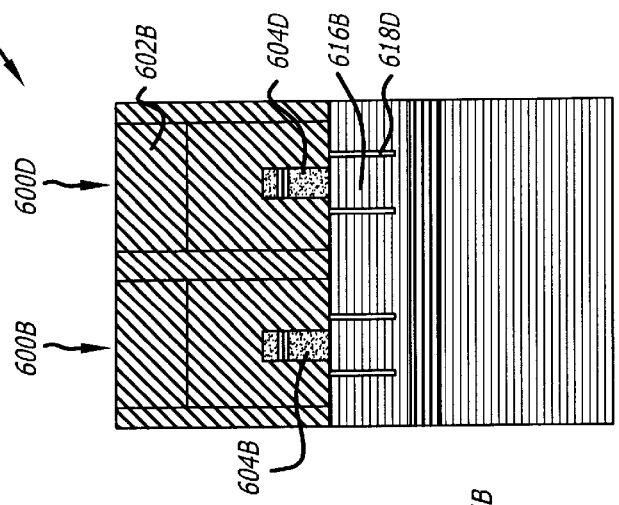
FIG. 9C is a magnified cross-sectional front view of the integrated optically pumped vertical cavity surface emitting laser of FIG. 9B.
Figure 9B:
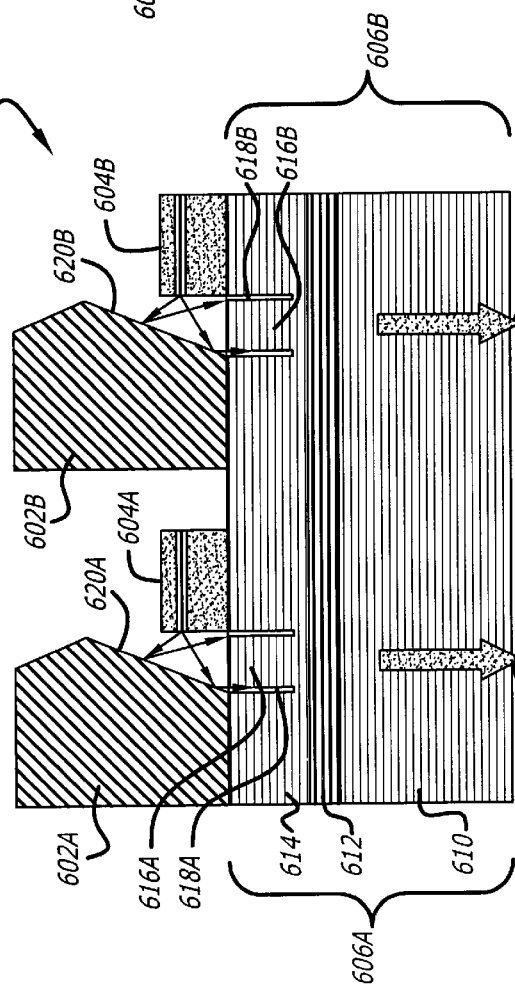
FIG. 9B is a magnified side view of another embodiment of an integrated optically pumped vertical cavity surface emitting laser.

Referring now to FIGS. 9B–9D, an array 900 of integrated optically pumped VCSELs is illustrated. The array 900 utilizes the embodiment of the integrated optically pumped VCSEL 600 of FIGS. 6A–6C arrayed and illustrated by the four VCSELs 600A, 600B, 600C, and 600D. It is to be understood that a wafer can contain more than four VCSELs 600. In a first wafer, an array of VCSELs 606 are formed each having its own mesa region 616 and air gap 618 as illustrated by mesa regions 616A, 616B and air gaps 618A and 618B. An array of edge emitting laser diodes 604 can be formed in a second wafer and wafer bonded to the first wafer using wafer bonding techniques. The wafers are first aligned using alignment marks and alignment techniques well known in semiconductor manufacturing. The array of edge emitting laser diodes 604 is illustrated as EELDs 604A, 604B, 604C, and 604D in FIGS. 9B–9D. Next rows of beam steering elements 602 can be wafer bonded to the first wafer of VCSELs 606. The rows of beam steering elements are illustrated in FIGS. 9B–9D as beam steering elements 902A and 902B. Each row of beam steering elements has the facet 620 to steer photons emitted by the edge emitting laser 604 into the respective VCSEL 606. The rows of beam steering elements can use similar wafer bonding techniques depending upon the material from which they are formed.

Figure 10:
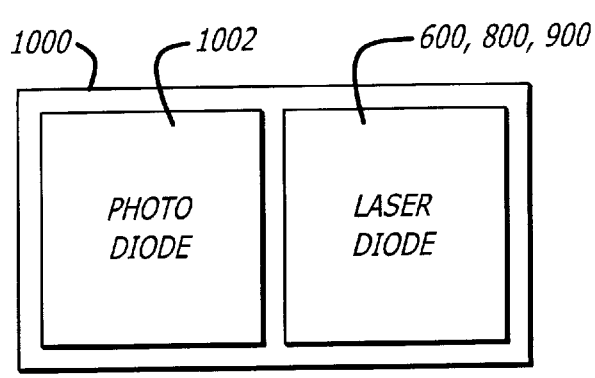
FIG. 10 illustrates a substrate including a laser diode of the invention and a photo diode as another embodiment of the invention.

Referring now to FIG. 10, a substrate 1000 including the integrated optically pumped VCSELs (i.e. a laser diode) of the invention (such as the integrated optically pumped VCSELs 600, 800, 900) and a photo diode 1002 are illustrated. The photo diode 1002 is used to monitor the power output of the integrated optically pumped VCSEL. Exemplary embodiments of the photo diode 1002 are a PN photo diode an a PIN photo diode.

Figure 11:
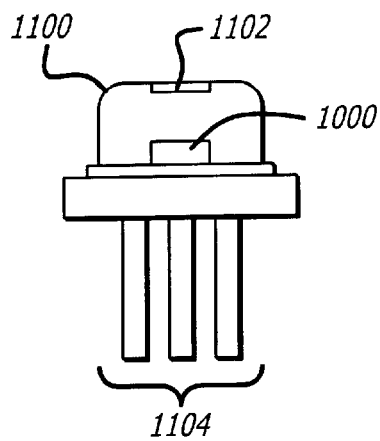
FIG. 11 illustrates a cross sectional view of a packaged laser diode transmitter including the laser diode of the invention as another embodiment of the invention.

Referring now to FIG. 11, a packaged laser diode transmitter 1100 is illustrated. The packaged laser diode transmitter 1100 includes a substrate 1000, a window 1102, and on or more pins or an electrical connector 1104. The substrate 1000 includes one of the integrated optically pumped VCSELs of the invention. The substrate 1000 may also include a photo diode to monitor the power output of the laser diode. The window 1102 allows the photons or light generated by integrated optically pumped VCSEL to be emitted from the package. The window 1102 can also provide for a partial reflection of the photons or light down to the photo diode for output power measurement.

Figure 12:
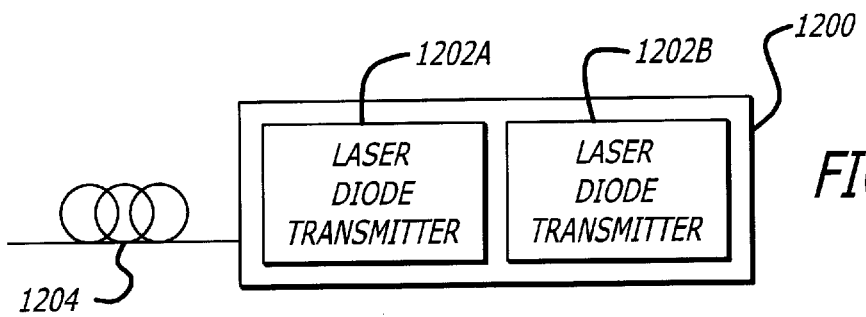
FIG. 12 illustrates an optoelectronic module incorporating the laser diode as another embodiment of the invention.

Referring now to FIG. 12, an optoelectronic module 1200 is illustrated. The optoelectronic module 1200 includes one or more laser diode transmitters 1202A and 1202B. The optoelectronic module 1200 couples to one or more optical fibers 1204. The one or more laser diode transmitters 1202A and 1202B, include the optical subassembly having an integrated optically pumped VCSEL of the invention such as the integrated optically pumped VCSELs 600, 800, and 900.

Figure 13:
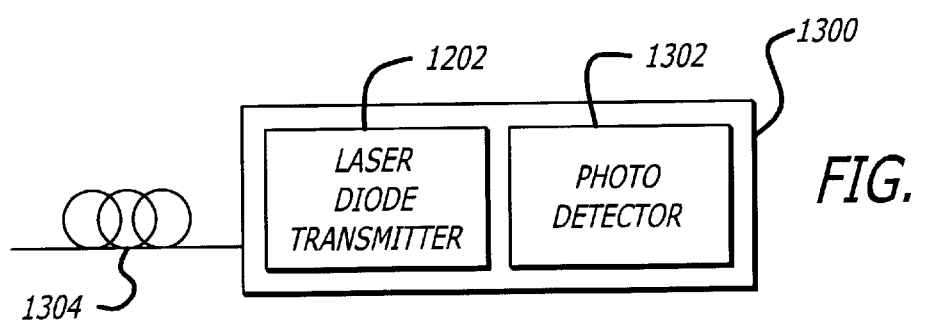
FIG. 13 illustrates another optoelectronic module incorporating the laser diode as another embodiment of the invention.

Referring now to FIG. 13, an optoelectronic module 1300 is illustrated. The optoelectronic module 1300 includes one or more laser diode transmitters 1202 and one or more photodetectors 1302. The optoelectronic module 1300 couples to one or more optical fibers 1304. The one or more laser diode transmitters 1202, include the optical subassembly having an integrated optically pumped VCSEL of the invention such as the integrated optically pumped VCSELs 600, 800, and 900.

An optoelectronic module can also referred to as a fiber channel module, an FDDI module, a fiber optic module, a fiber optic modem, or a physical layer device. Additionally, an optoelectronic module can couple to a host printed circuit board in a number of ways. The optoelectronic module can be fixed or replaceable. A fixed optoelectronic module has pins which are typically soldered to the host printed circuit board. The replaceable optoelectronic module typically has a connector with pins or traces which couple to a connector or socket of the host printed circuit board.

Figure 14:
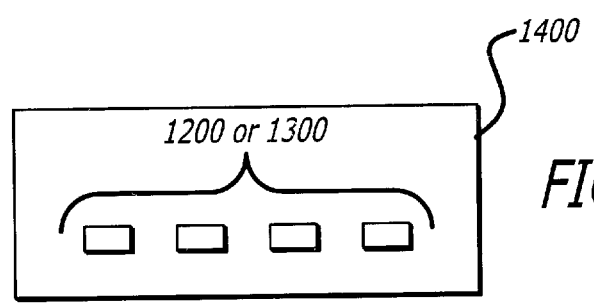
FIG. 14 illustrates a block diagram of an optoelectronic system employing the laser diode as another embodiment of the invention.

Referring now to FIG. 14, an optoelectronic system 1400 is illustrated. The optoelectronic system 1400 can be utilized to in an optical communication system, optical networking system, or other system where transfer of information is desirable over optical fibers by means of light or photons. The optoelectronic system 1400 includes one or more optoelectronic modules 1200 or 1300 or a combination thereof. The optoelectronic system 1400 couples to one or more optical fibers.

The invention has a number of advantages which will become obvious to those of ordinary skill in the art after thoroughly reading this disclosure.

The preferred embodiments of the invention are thus described. While the invention has been described in particular embodiments, the invention should not be construed as limited by such embodiments, but rather construed according to the claims that follow below.

What is claimed is:

1. A semiconductor laser comprising:
   an optically pumped vertical cavity surface emitting laser;
   an electrically pumped edge emitting laser coupled to the optically pumped vertical cavity surface emitting laser, the electrically pumped edge emitting laser to generate first photons at a first wavelength;
   a beam steering element coupled to the optically pumped vertical cavity surface emitting laser, the beam steering element to steer the first photons from the electrically pumped edge emitting laser to the optically pumped vertical cavity surface emitting laser; and
   the optically pumped vertical cavity surface emitting laser to generate second photons at a second wavelength greater than the first wavelength in response to receiving the first photons.

2. The semiconductor laser of claim 1 wherein,
   the electrically pumped edge emitting laser is modulated to modulate the generation of second photons by the optically pumped vertical cavity surface emitting laser.

3. The semiconductor laser of claim 1 wherein,
   the electrically pumped edge emitting laser is formed to generate first photons at a wavelength over a wavelength range of 600 nanometers to 1150 nanometers when being electrically pumped.

4. The semiconductor laser of claim 1 wherein,
   the optically pumped vertical cavity surface emitting laser is formed to generate second photons at a wavelength over a wavelength range of 1200 nanometers to 1750 nanometers when being optically pumped.

5. The semiconductor laser of claim 1 wherein, the beam steering element is a silicon bench with an angled facet.

6. The semiconductor laser of claim 1 wherein,
   the beam steering element is made of polymer materials.

7. The semiconductor laser of claim 1 wherein,
   the beam steering element is an external beam steering mirror.

8. The semiconductor laser of claim 1 wherein,
   the electrically pumped edge emitting laser includes the beam steering element.

9. The semiconductor laser of claim 7 wherein,
   the beam steering element is an angled facet included in the electrically pumped edge emitting laser.

10. A semiconductor laser comprising:

an optically pumped vertical cavity surface emitting laser;

an electrically pumped edge emitting laser coupled to the optically pumped vertical cavity surface emitting laser, the electrically pumped edge emitting laser to generate first photons at a first wavelength;

a silicon bench coupled to the optically pumped vertical cavity surface emitting laser, the silicon bench including an angled facet to steer the first photons from the electrically pumped edge emitting laser to the optically pumped vertical cavity surface emitting laser; and the optically pumped vertical cavity surface emitting laser to generate second photons at a second wavelength greater than the first wavelength in response to receiving the first photons.

11. The semiconductor laser of claim 10 wherein, the electrically pumped edge emitting laser is modulated to modulate the generation of first photons and second photons by the optically pumped vertical cavity surface emitting laser.

12. The semiconductor laser of claim 10 wherein, the electrically pumped edge emitting laser is formed to generate first photons at a wavelength over a wavelength range of 600 nanometers to 1150 nanometers when being electrically pumped.

13. The semiconductor laser of claim 10 wherein, the optically pumped vertical cavity surface emitting laser is formed to generate second photons at a wavelength over a wavelength range of 1200 nanometers to 1750 nanometers when being optically pumped.

14. A semiconductor laser comprising:

an optically pumped vertical cavity surface emitting laser;

an electrically pumped edge emitting laser coupled to the optically pumped vertical cavity surface emitting laser, the electrically pumped edge emitting laser to generate first photons at a first wavelength, the electrically pumped edge emitting laser having an angled facet at one end to steer the first-photons from a cavity of the electrically pumped edge emitting laser to the optically pumped vertical cavity surface emitting laser; and the optically pumped vertical cavity surface emitting laser to generate second photons at a second wavelength greater than the first wavelength in response to receiving the first photons.

15. The semiconductor laser of claim 14 wherein, the electrically pumped edge emitting laser is modulated to modulate the generation of first photons and second photons by the optically pumped vertical cavity surface emitting laser.

16. The semiconductor laser of claim 14 wherein, the electrically pumped edge emitting laser is formed to generate first photons at a wavelength over a wavelength range of 600 nanometers to 1150 nanometers when being electrically pumped.

17. The semiconductor laser of claim 14 wherein, the optically pumped vertical cavity surface emitting laser is formed to generate second photons at a wavelength over a wavelength range of 1200 nanometers to 1750 nanometers when being optically pumped.

18. A semiconductor laser comprising:

an optically pumped vertical cavity surface emitting laser;

an electrically pumped edge emitting laser coupled to the optically pumped vertical cavity surface emitting laser, the electrically pumped edge emitting laser to generate first photons at a first wavelength;

an external beam steering mirror coupled to the optically pumped vertical cavity surface emitting laser, the external beam steering mirror to steer the first photons from the electrically pumped edge emitting laser to the optically pumped vertical cavity surface emitting laser; and the optically pumped vertical cavity surface emitting laser to generate second photons at a second wavelength greater than the first wavelength in response to receiving the first photons.

19. The semiconductor laser of claim 18 wherein, the electrically pumped edge emitting laser is modulated to modulate the generation of first photons and second photons by the optically pumped vertical cavity surface emitting laser.

20. The semiconductor laser of claim 18 wherein, the electrically pumped edge emitting laser is formed to generate first photons at a wavelength over a wavelength range of 600 nanometers to 1150 nanometers when being electrically pumped.

21. The semiconductor laser of claim 18 wherein, the optically pumped vertical cavity surface emitting laser is formed to generate second photons at a wavelength over a wavelength range of 1200 nanometers to 1750 nanometers when being optically pumped.

22. A semiconductor laser comprising:

an index guided optically pumped vertical cavity surface emitting laser;

an electrically pumped edge emitting laser coupled to the optically pumped vertical cavity surface emitting laser, the electrically pumped edge emitting laser to generate first photons at a first wavelength;

a beam steering element coupled to the optically pumped vertical cavity surface emitting laser, the beam steering element to steer the first photons from the electrically pumped edge emitting laser to the index guided optically pumped vertical cavity surface emitting laser; and the index guided optically pumped vertical cavity surface emitting laser to generate second photons at a second wavelength greater than the first wavelength in response to receiving the first photons.

23. The semiconductor laser of claim 22 wherein, the electrically pumped edge emitting laser is modulated to modulate the generation of second photons by the index guided optically pumped vertical cavity surface emitting laser.

24. The semiconductor laser of claim 22 wherein, the electrically pumped edge emitting laser is formed to generate first photons at a wavelength over a wavelength range of 600 nanometers to 1150 nanometers when being electrically pumped.

25. The semiconductor laser of claim 22 wherein, the index guided optically pumped vertical cavity surface emitting laser is formed to generate second photons at a wavelength over a wavelength range of 1200 nanometers to 1750 nanometers when being optically pumped.

26. The semiconductor laser of claim 22 wherein, the beam steering element is a silicon bench with an angled facet.

27. The semiconductor laser of claim 22 wherein, the beam steering element is made of polymer materials.

28. The semiconductor laser of claim 22 wherein, the beam steering element is an external beam steering mirror.

29. The semiconductor laser of claim 22 wherein, the electrically pumped edge emitting laser includes the beam steering element.

30. The semiconductor laser of claim 29 wherein, the beam steering element is an angled facet included in the electrically pumped edge emitting laser.

31. A fiber optic module comprising:

a transmitter to transmit signals, the transmitter including
an optically pumped vertical cavity surface emitting laser;
an electrically pumped edge emitting laser coupled to the optically pumped vertical cavity surface emitting laser, the electrically pumped edge emitting laser to generate first photons at a first wavelength;
a beam steering element coupled to the optically pumped vertical cavity surface emitting laser, the beam steering element to steer the first photons from the electrically pumped edge emitting laser to the optically pumped vertical cavity surface emitting laser; and
the optically pumped vertical cavity surface emitting laser to generate second photons at a second wavelength greater than the first wavelength in response to receiving the first photons.

32. The fiber optic module of claim 31 wherein, the electrically pumped edge emitting laser is modulated to modulate the generation of second photons by the optically pumped vertical cavity surface emitting laser.

33. The fiber optic module of claim 31 wherein, the electrically pumped edge emitting laser is formed to generate first photons at a wavelength over a wavelength range of do 600 nanometers to 1150 nanometers when being electrically pumped.

34. The fiber optic module of claim 31 wherein, the optically pumped vertical cavity surface emitting laser is formed to generate second photons at a wavelength over a wavelength range of 1200 nanometers to 1750 nanometers when being optically pumped.

35. The fiber optic module of claim 31 wherein, the beam steering element is a silicon bench with an angled facet.

36. The fiber optic module of claim 31 wherein, the beam steering element is made of polymer materials.

37. The fiber optic module of claim 31 wherein, the beam steering element is an external beam steering mirror.

38. The fiber optic module of claim 31 wherein, the electrically pumped edge emitting laser includes the beam steering element.

39. The fiber optic module of claim 38 wherein, the beam steering element is an angled facet included in the electrically pumped edge emitting laser.

40. The fiber optic module of claim 31 wherein, the optically pumped vertical cavity surface emitting laser is index guided.

41. The fiber optic module of claim 31 wherein, the transmitter further includes
a photodiode to measure the power output of the transmitter.

42. The fiber optic module of claim 31 further comprising:

a photodetector to receive signals.

43. A method comprising:

electrically pumping an edge emitting laser to generate a pump laser beam;
steering the pump laser beam to a vertical cavity surface emitting laser;
optically pumping the vertical cavity surface emitting laser; and
emitting a long wavelength laser beam in response to the optical pumping.

44. The method of claim 43 further comprising:

index guiding the vertical cavity surface emitting laser.

45. The method of claim 43 further comprising:

modulating the electrical pumping of the edge emitting laser to modulate the emission of the long wavelength laser beam.

46. An integrated optically pumped vertical cavity surface emitting laser comprising:

a vertical cavity surface emitting laser, the vertical cavity surface emitting laser including
a first mirror stack,
an active region coupled to the first mirror stack, the active region having one or more quantum well structures, and
a second mirror stack coupled to the active region; an edge emitting laser coupled to the first mirror stack of the vertical cavity surface emitting laser, the edge emitting laser to generate a pump beam at a first wavelength; and
a beam steering element coupled to the first mirror stack of the vertical cavity surface emitting laser, the beam steering element to steer the pump beam from the edge emitting laser to the vertical cavity surface emitting laser to optically pump the vertical cavity surface into emitting a long wavelength laser beam of a second wavelength greater than the first wavelength.

47. The integrated optically pumped vertical cavity surface emitting laser of claim 46 wherein, the active region has one of Indium-Gallium-Arsenide-nitride quantum dots structures, Indium-Aluminum-Gallium-Arsenide quantum well structures, and Indium-Gallium-Arsenide Phosphide quantum well structures.

48. The integrated optically pumped vertical cavity surface emitting laser of claim 46 wherein, the first and second mirror stacks are Aluminum-Gallium-Arsenide distributed Bragg reflectors.

49. The integrated optically pumped vertical cavity surface emitting laser of claim 46 wherein, one of the first and second mirror stacks is made of dielectric materials.

50. The integrated optically pumped vertical cavity surface emitting laser of claim 46 wherein, the first mirror stack has a cylindrical shaped air gap forming a mesa to index guide the vertical cavity surface emitting laser.

51. The integrated optically pumped vertical cavity surface emitting laser of claim 50 wherein, the air gap is formed in the first mirror stack by dry or wet etching the layers.

52. The integrated optically pumped vertical cavity surface emitting laser of claim 46 wherein, the edge emitting laser is coupled to the vertical cavity surface emitting laser through one of the set of atomic bonding, wafer bonding, metal bonding, and epoxy bonding.

53. The integrated optically pumped vertical cavity surface emitting laser of claim 46 wherein, the beam steering element is coupled to the vertical cavity surface emitting laser through one of the set of atomic bonding, wafer bonding, metal bonding, and epoxy bonding.

54. The integrated optically pumped vertical cavity surface emitting laser of claim 46 wherein,
the edge emitting laser is modulated to modulate the pump beam and the long wavelength laser beam emitted by the vertical cavity surface emitting laser.

55. The integrated optically pumped vertical cavity surface emitting laser of claim 46 wherein,
the electrically pumped edge emitting laser is formed to a generate first photons at a wavelength over a wavelength range of 600 nanometers to 1150 nanometers when being electrically pumped.

56. The integrated optically pumped vertical cavity surface emitting laser of claim 46 wherein,
the optically pumped vertical cavity surface emitting laser is formed to generate second photons at a wavelength over a wavelength range of 1200 nanometers to 1750 nanometers when being optically pumped.

57. The integrated optically pumped vertical cavity surface emitting laser of claim 46 wherein,
the beam steering element is a silicon bench with an angled facet.

58. The integrated optically pumped vertical cavity surface emitting laser of claim 46 wherein,
the beam steering element is a made of polymer materials.

59. The integrated optically pumped vertical cavity surface emitting laser of claim 46 wherein,
the beam steering element is an external beam steering mirror.

60. The integrated optically pumped vertical cavity surface emitting laser of claim 46 wherein,
the edge emitting laser includes the beam steering element.

61. The integrated optically pumped vertical cavity surface emitting laser of claim 60 wherein,
the beam steering element is an angled facet included in the edge emitting laser.

62. A modulated integrated optically pumped vertical cavity surface emitting laser comprising:
a modulated electrically pumped edge emitting laser to generate photons;
a beam steering element to steer the photons generated by the modulated electrically pumped edge emitting laser; and
an optically pumped vertical cavity surface emitting laser coupled to the modulated electrically pumped edge emitting laser and beam steering element, the optically pumped vertical cavity surface emitting laser to receive the photons steered by the beam steering element and to lase in response thereto and emit photons from the modulated integrated optically pumped vertical cavity surface emitting laser.

63. The integrated optically pumped vertical cavity surface emitting laser of claim 62 wherein,
the modulated electrically pumped edge emitting laser is coupled to the vertical cavity surface emitting laser through one of the set of atomic bonding, wafer bonding, metal bonding, and epoxy bonding.

64. The integrated optically pumped vertical cavity surface emitting laser of claim 62 wherein,
the beam steering element is coupled to the optically pumped vertical cavity surface emitting laser through one of the set of atomic bonding, wafer bonding, metal bonding, and epoxy bonding.

65. The integrated optically pumped vertical cavity surface emitting laser of claim 62 wherein,
the modulated electrically pumped edge emitting laser is modulated to modulate the photons generated thereby and to modulate the photons emitted by the optically pumped vertical cavity surface emitting laser.

66. The integrated optically pumped vertical cavity surface emitting laser of claim 62 wherein,
the modulated electrically pumped edge emitting laser is formed to generate photons at a wavelength over a wavelength range of 600 nanometers to 1150 nanometers when electrically pumped.

67. The integrated optically pumped vertical cavity surface emitting laser of claim 62 wherein,
the optically pumped vertical cavity surface emitting laser is formed to emit photons at a wavelength over a wavelength range of 1200 nanometers to 1750 nanometers when optically pumped.

68. The integrated optically pumped vertical cavity surface emitting laser of claim 62 wherein,
the beam steering element is a silicon bench with an angled facet.

69. The integrated optically pumped vertical cavity surface emitting laser of claim 62 wherein,
the beam steering element is a made of polymer materials.

70. The integrated optically pumped vertical cavity surface emitting laser of claim 62 wherein,
the beam steering element is an external beam steering mirror.

71. The integrated optically pumped vertical cavity surface emitting laser of claim 62 wherein,
the modulated electrically pumped edge emitting laser includes the beam steering element.

72. The integrated optically pumped vertical cavity surface emitting laser of claim 71 wherein,
the beam steering element is an angled facet included in the modulated electrically pumped edge emitting laser.

73. The integrated optically pumped vertical cavity surface emitting laser of claim 62 wherein,
the modulated electrically pumped edge emitting laser is modulated in response to a data signal.

74. The integrated optically pumped vertical cavity surface emitting laser of claim 62 wherein,
the optically pumped vertical cavity surface emitting laser includes
an active region having one or more quantum wells,
a first mirror stack,
a second mirror stack, and
wherein the active region is sandwiched between the first mirror stack and the second mirror stack.

75. The integrated optically pumped vertical cavity surface emitting laser of claim 74 wherein,
the optically pumped vertical cavity surface emitting laser is index guided and
the first mirror stack includes an air gap region forming a mesa region to receive photons generated by the modulated electrically pumped edge emitting laser.

76. The integrated optically pumped vertical cavity surface emitting laser of claim 75 wherein,
the modulated electrically pumped edge emitting laser coupled to the optically pumped vertical cavity surface emitting laser extends up to the air gap in the first mirror stack, and
the beam steering element is a silicon bench coupled to the optically pumped vertical cavity surface emitting laser opposite the modulated electrically pumped edge emitting laser, the silicon bench having a facet extending over the air gap and the mesa region towards the modulated electrically pumped edge emitting laser to steer photons from the modulated electrically pumped edge emitting laser into the mesa region of the optically pumped vertical cavity surface emitting laser.

77. The integrated optically pumped vertical cavity surface emitting laser of claim 75 wherein, the modulated electrically pumped edge emitting laser coupled to the optically pumped vertical cavity surface emitting laser extends up to the air gap in the first mirror stack, and the beam steering element is made of polymer materials coupled to the optically pumped vertical cavity surface emitting laser opposite the modulated electrically pumped edge emitting laser, the polymer steering element having an angled surface extending over the air gap and the mesa region towards the modulated electrically pumped edge emitting laser to steer photons from the modulated electrically pumped edge emitting laser into the mesa region of the optically pumped vertical cavity surface emitting laser.

78. The integrated optically pumped vertical cavity surface emitting laser of claim 75 wherein, the first mirror stack includes a confinement layer in the mesa region.

79. The integrated optically pumped vertical cavity surface emitting laser of claim 77 wherein, the confinement layer is laterally oxidized to form a ring to provide index guiding to the photons from the optically pumped vertical cavity surface emitting laser.

80. The integrated optically pumped vertical cavity surface emitting laser of claim 75 wherein, the beam steering element is a facet included in one end of the modulated electrically pumped edge emitting laser, and the modulated electrically pumped edge emitting laser is coupled to the optically pumped vertical cavity surface emitting laser with the facet on the one end extending over onto the mesa region to steer photons from the modulated electrically pumped edge emitting laser into the mesa region of the optically pumped vertical cavity surface emitting laser.

81. The integrated optically pumped vertical cavity surface emitting laser of claim 80 wherein, the first mirror stack includes a confinement layer in the mesa region.

82. The integrated optically pumped vertical cavity surface emitting laser of claim 81 wherein, the confinement layer is laterally oxidized to form a ring to provide index guiding to the photons from the optically pumped vertical cavity surface emitting laser.

83. The integrated optically pumped vertical cavity surface emitting laser of claim 75 wherein, the beam steering element is an external mirror coupled to the optically pumped vertical cavity surface emitting laser on the mesa region, the modulated electrically pumped edge emitting laser is coupled to the optically pumped vertical cavity surface emitting laser with one end extending over onto the mesa region to couple photons into the external mirror, the external mirror coupled to the mesa region of optically pumped vertical cavity surface emitting laser on an angle to steer photons from the modulated electrically pumped edge emitting laser into the mesa region of the optically pumped vertical cavity surface emitting laser.

84. The integrated optically pumped vertical cavity surface emitting laser of claim 83 wherein, the first mirror stack includes a confinement layer in the mesa region.

85. The integrated optically pumped vertical cavity surface emitting laser of claim 84 wherein, the confinement layer is laterally oxidized to form a ring to provide index guiding to the photons from the optically pumped vertical cavity surface emitting laser.

86. The integrated optically pumped vertical cavity surface emitting laser of claim 62 wherein, the beam steering element is a laser cavity mirror formed by etching a facet at an angle in the edge emitting laser to steer the photons within the laser cavity and to steer photons to the optically pumped vertical cavity surface emitting laser.

87. The integrated optically pumped vertical cavity surface emitting laser of claim 86 wherein, the angle that the facet is etched is about forty-five degrees.

88. The integrated optically pumped vertical cavity surface emitting laser of claim 62 wherein, the optically pumped vertical cavity surface emitting laser is a long wavelength optically pumped vertical cavity surface emitting laser having an active region formed of one or more Indium-Gallium-Arsenide-Phosphide quantum wells to be optically pumped and emit photons of a relatively long wavelength.

89. The integrated optically pumped vertical cavity surface emitting laser of claim 62 wherein, the optically pumped vertical cavity surface emitting laser is a long wavelength optically pumped vertical cavity surface emitting laser having an active region formed of one or more Indium-Aluminum-Gallium-Arsenide quantum wells to be optically pumped and emit photons of a relatively long wavelength.

90. The integrated optically pumped vertical cavity surface emitting laser of claim 62 wherein, the optically pumped vertical cavity surface emitting laser is a long wavelength optically pumped vertical cavity surface emitting laser having an active region formed of one or more Gallium-Arsenide-Antimonide quantum wells to be optically pumped and emit photons of a relatively long wavelength.

91. The integrated optically pumped vertical cavity surface emitting laser of claim 62 wherein, the optically pumped vertical cavity surface emitting laser is a long wavelength optically pumped vertical cavity surface emitting laser having an active region formed of one or more Indium-Gallium-Arsenide-Nitride quantum wells to be optically pumped and emit photons of a relatively long wavelength.

92. The integrated optically pumped vertical cavity surface emitting laser of claim 74 wherein, the first mirror stack is a dielectric mirror.

93. The integrated optically pumped vertical cavity surface emitting laser of claim 74 wherein, the second mirror stack is a dielectric mirror.

94. The integrated optically pumped vertical cavity surface emitting laser of claim 74 wherein, the optically pumped vertical cavity surface emitting laser includes an oxide region in the first mirror stack to guide photons to emit at a single transverse mode.-

95. The integrated optically pumped vertical cavity surface emitting laser of claim 74 wherein, the optically pumped vertical cavity surface emitting laser includes one or more mesa regions patterned in the first mirror stack to index guide photons to emit at a single transverse mode.

96. A semiconductor laser apparatus comprising:

a first semiconductor laser;

a second semiconductor laser integrated with the first semiconductor laser;

the first semiconductor laser being responsive to electrical pumping;

the second semiconductor laser being responsive to optical pumping by the first semiconductor laser;

means for index guiding the second semiconductor laser; and at least one beam steering element integrated with the first and second semiconductor lasers, the at least one beam steering element to steer photons of the first semiconductor laser into a mesa region of the second semiconductor laser.

97. The semiconductor laser apparatus of claim 96 wherein:

the means for index guiding is an air gap region formed around the mesa region of the second semiconductor laser.

98. The semiconductor laser apparatus of claim 96 wherein:

the means for index guiding is a confinement region formed in the mesa region.

99. A method of modulating an optically pumped vertical cavity surface emitting laser, the method comprising:

providing an electrically pumped edge emitting laser;

modulating the photonic emission of the electrically pumped edge emitting laser in response to a data modulation signal;

steering the modulated photonic emission of the electrically pumped edge emitting laser into an optically pumped vertical cavity surface emitting laser; and index guiding the optically pumped vertical cavity surface emitting laser to generate a modulated laser beam output in response to modulating the photonic emission of the electrically pumped edge emitting laser at high frequencies.

100. The method of claim 99 wherein, the electrically pumped edge emitting laser generates photons of a relatively short wavelength and the optically pumped vertical cavity surface emitting laser generates a modulated laser beam output having a relatively long wavelength.

\* \* \* \* \*